(12) United States Patent
McCarthy et al.

(10) Patent No.: US 6,768,420 B2
(45) Date of Patent: Jul. 27, 2004

(54) VEHICLE COMPARTMENT OCCUPANCY DETECTION SYSTEM

(75) Inventors: Kevin C. McCarthy, Tucson, AZ (US);
Lori L. Burgner, Fenton, MI (US);
David W. Taylor, Fenton, MI (US);
Niall R. Lynam, Holland, MI (US);
Eugenie V. Uhlmann, Tucson, AZ
(US); Mitchell J. Hourtienne, Clio, MI
(US); Kenneth Schofield, Holland, MI
(US)

(73) Assignee: Donnelly Corporation, Holland, MI (US)

( * ) Notice: Subject to any disclaimer, the term of this patent is extended or adjusted under 35 U.S.C. 154(b) by 121 days.

(21) Appl. No.: 09/992,119

(22) Filed: Nov. 14, 2001

(65) Prior Publication Data

US 2002/0080014 A1 Jun. 27, 2002

Related U.S. Application Data

(60) Provisional application No. 60/249,320, filed on Nov. 16, 2000, provisional application No. 60/310,344, filed on Aug. 6, 2001, and provisional application No. 60/326,373, filed on Oct. 1, 2001.

(51) Int. Cl.[7] .............................................. G08B 13/14
(52) U.S. Cl. ................ 340/573.1; 340/425.5; 340/584; 340/562; 340/588; 340/457.1; 701/45; 180/272
(58) Field of Search ........................ 340/425.5, 588, 340/573.1, 561, 562, 584, 563, 573.4, 686.1, 457.1, 436; 701/45; 189/272; 292/336.3; 362/501; 600/300

(56) References Cited

U.S. PATENT DOCUMENTS 1,523,495 A  1/1925  Silberman ................ 362/501
1,629,456 A  5/1927  Pellegrini ................ 362/501
1,684,499 A  9/1928  Mayer ..................... 292/336.3

(List continued on next page.)

FOREIGN PATENT DOCUMENTS

| DE | 2636099 | 2/1978 |
| DE | 3732936 | 9/1987 |
| DE | 9006007 | 6/1991 |
| EP | 0235372 | 11/1986 |
| EP | 1039077 | 9/2000 |

(List continued on next page.)

OTHER PUBLICATIONS

Tritium Gasfilled Lightsources (GTLS) http://www.rctritec.com/.tgtls.html—RC TRITEC AG, Tritium Technology Jan. 2001 one page.

(List continued on next page.)

Primary Examiner—Benjamin C. Lee
(74) Attorney, Agent, or Firm—Van Dyke, Gardner, Linn & Burkhart, LLP

(57) ABSTRACT

A vehicle compartment occupancy detection system is operable to detect a presence of a person or animal within a vehicle compartment, such as a vehicle cabin or trunk space, by detecting a change in an electric field within the compartment. The detection system includes an electric field generator and an electric field sensor which is operable to detect changes in the electric field generated within the compartment. The detection system may further be operable to activate an accessory in response to one or more inputs and the electric field sensor. The detection system may be operable in response to one or more inputs which are indicative of a hazardous condition within the vehicle compartment. The detection system may then be operable to take corrective action to at least partially alleviate the hazardous condition and/or to communicate to a person exteriorly of the vehicle that the hazardous condition exists.

46 Claims, 11 Drawing Sheets

U.S. PATENT DOCUMENTS

| | | | |
|---|---|---|---|
| 1,721,347 A | 7/1929 | Macrae et al. | 362/501 |
| 2,117,160 A | 5/1938 | Gale | 292/336.3 |
| 2,360,227 A | 10/1944 | Hemphill | 180/273 |
| 2,688,865 A | 9/1954 | Foster et al. | 70/129 |
| 2,760,050 A | 8/1956 | Porsche | 362/501 |
| 3,016,968 A | 1/1962 | Lenz et al. | 180/89.1 |
| 3,241,344 A | 3/1966 | Peters | 70/279.1 |
| 3,553,448 A | 1/1971 | Davis et al. | 362/496 |
| 3,582,639 A | 6/1971 | Chamberlain | 362/542 |
| 3,596,484 A | 8/1971 | Peters | 70/150 |
| 3,678,716 A | 7/1972 | Cobb | 70/92 |
| 3,759,556 A | 9/1973 | Wright | 292/33 |
| 3,766,539 A | 10/1973 | Bradshaw et al. | 340/567 |
| 3,829,693 A | 8/1974 | Schwarz | 250/338.1 |
| 3,839,640 A | 10/1974 | Rossin | 250/353 |
| 3,956,732 A | 5/1976 | Teich | 340/430 |
| 3,992,909 A | 11/1976 | McGhee | 70/379 R |
| 4,007,955 A | 2/1977 | Kobayashi | 292/216 |
| 4,052,716 A | 10/1977 | Mortensen | 340/552 |
| 4,080,812 A | 3/1978 | Knott | 70/256 |
| 4,122,371 A | 10/1978 | Talmage et al. | 315/84 |
| 4,127,966 A | 12/1978 | Schmidt | 49/141 |
| 4,155,233 A | 5/1979 | Lira | 70/92 |
| 4,166,955 A | 9/1979 | Keller | 250/342 |
| 4,242,669 A | 12/1980 | Crick | 340/567 |
| 4,312,197 A | 1/1982 | Carrion et al. | 70/135 |
| 4,318,089 A | 3/1982 | Frankel et al. | 340/567 |
| 4,322,959 A | 4/1982 | Mochida | 70/24 |
| 4,342,210 A | 8/1982 | Denningham | 70/278 |
| 4,365,232 A | 12/1982 | Miller | 340/945 |
| 4,371,205 A | 2/1983 | Kaveney, Jr. | 292/48 |
| 4,379,971 A | 4/1983 | Smith et al. | 250/342 |
| 4,384,207 A | 5/1983 | Doctor | 250/349 |
| 4,418,335 A | 11/1983 | Genähr | 340/565 |
| 4,437,003 A | 3/1984 | Doctor | 250/338.3 |
| 4,441,023 A | 4/1984 | Doctor et al. | 250/338.3 |
| 4,464,649 A | 8/1984 | Her | 340/471 |
| 4,468,657 A | 8/1984 | Rossin | 340/555 |
| 4,482,179 A | 11/1984 | Johnson | 292/336.3 |
| 4,507,654 A | 3/1985 | Stolarczyk et al. | 340/545.3 |
| 4,546,417 A | 10/1985 | Watts | 362/84 |
| 4,556,796 A | 12/1985 | Renals | 250/338.3 |
| 4,604,524 A | 8/1986 | Kotlicki et al. | 250/342 |
| 4,612,442 A | 9/1986 | Toshimichi | 250/353 |
| 4,645,233 A | 2/1987 | Bruse et al. | 280/801.2 |
| 4,667,990 A | 5/1987 | Quantz | 292/201 |
| 4,697,081 A | 9/1987 | Baker | 250/338.3 |
| 4,704,533 A | 11/1987 | Rose et al. | 250/342 |
| 4,709,153 A | 11/1987 | Schofield | 250/353 |
| 4,745,284 A | 5/1988 | Masuda et al. | 250/338.3 |
| 4,746,910 A | 5/1988 | Pfister et al. | 340/567 |
| 4,752,768 A | 6/1988 | Steers et al. | 340/567 |
| 4,764,755 A | 8/1988 | Pedtke et al. | 340/541 |
| 4,775,347 A | 10/1988 | Takada et al. | 445/44 |
| 4,796,013 A | 1/1989 | Yasuda et al. | 340/562 |
| 4,797,657 A | 1/1989 | Vorzimmer et al. | 340/541 |
| 4,825,079 A | 4/1989 | Takamatsu et al. | 250/338.3 |
| 4,848,114 A | 7/1989 | Rippe | 70/273 |
| 4,848,509 A | 7/1989 | Bruhnke et al. | 180/287 |
| 4,857,912 A | 8/1989 | Everett, Jr. et al. | 340/508 |
| 4,868,390 A | 9/1989 | Keller et al. | 250/338.3 |
| 4,881,148 A | 11/1989 | Lambropoulos et al. | 361/172 |
| 4,895,009 A | 1/1990 | Kleefeldt et al. | 70/264 |
| 4,928,212 A | 5/1990 | Benavides | 362/459 |
| 4,930,864 A | 6/1990 | Kuster et al. | 359/350 |
| 4,933,668 A | 6/1990 | Oyer et al. | 340/541 |
| 4,952,808 A | 8/1990 | Turnbull et al. | 250/338.3 |
| 4,954,813 A | 9/1990 | August, Sr. et al. | 340/571 |
| 4,979,384 A | 12/1990 | Malesko et al. | 70/241 |
| 4,981,314 A | 1/1991 | Carr | 292/347 |
| 4,982,094 A | 1/1991 | Matsuda | 250/342 |
| 5,003,800 A | 4/1991 | Bublewicz | 70/264 |
| 5,027,104 A | 6/1991 | Reid | 340/541 |
| 5,030,012 A | 7/1991 | Hagins et al. | 374/31 |
| 5,045,702 A | 9/1991 | Mulleer | 250/342 |
| 5,054,686 A | 10/1991 | Chaung | 236/49.3 |
| 5,054,826 A | 10/1991 | Dow et al. | 292/125 |
| 5,063,371 A | 11/1991 | Oyer et al. | 340/541 |
| 5,071,160 A | 12/1991 | White et al. | 280/735 |
| 5,077,549 A | 12/1991 | Hershkovitz et al. | 340/567 |
| 5,084,696 A | 1/1992 | Guscott et al. | 340/541 |
| 5,093,656 A | 3/1992 | Dipoala | 340/522 |
| 5,166,679 A | 11/1992 | Vranish et al. | 340/870.37 |
| 5,174,643 A | 12/1992 | Priesemuth | 362/464 |
| 5,216,407 A | 6/1993 | Hwang | 340/426.22 |
| 5,219,413 A | 6/1993 | Lineberger | 180/272 |
| 5,231,359 A | 7/1993 | Masuda et al. | 324/675 |
| 5,283,551 A | 2/1994 | Guscott | 340/567 |
| 5,297,010 A | 3/1994 | Camarota et al. | 362/501 |
| 5,317,620 A | 5/1994 | Smith | 379/40 |
| 5,349,329 A | 9/1994 | Smith | 340/539.21 |
| 5,383,703 A | 1/1995 | Irvine, III | 296/181 |
| 5,404,128 A | 4/1995 | Ogino et al. | 340/425.5 |
| 5,406,171 A | 4/1995 | Moody | 315/77 |
| 5,409,273 A | 4/1995 | Claar et al. | 292/201 |
| 5,424,711 A | 6/1995 | Müller et al. | 340/426.26 |
| 5,424,712 A | 6/1995 | Rosenberger | 340/426.26 |
| 5,424,718 A | 6/1995 | Müller et al. | 340/567 |
| 5,445,326 A | 8/1995 | Ferro et al. | 292/336 |
| 5,482,314 A | 1/1996 | Corrado et al. | 280/735 |
| 5,486,810 A | 1/1996 | Schwarz | 340/521 |
| 5,512,836 A | 4/1996 | Chen et al. | 324/687 |
| 5,525,843 A | 6/1996 | Höwing | 307/9.1 |
| 5,550,677 A | 8/1996 | Schofield et al. | 359/604 |
| 5,580,153 A | 12/1996 | Motz | 362/496 |
| 5,581,230 A | 12/1996 | Barrett | 340/332 |
| 5,585,625 A | 12/1996 | Spies | 250/221 |
| 5,636,536 A | 6/1997 | Kinnucan | 70/107 |
| 5,663,704 A | 9/1997 | Allen et al. | 340/426.25 |
| 5,670,935 A | 9/1997 | Schofield et al. | 340/461 |
| 5,693,943 A | 12/1997 | Tchernihovski et al. | 250/342 |
| 5,711,559 A | 1/1998 | Davis | 292/340 |
| 5,719,551 A | 2/1998 | Flick | 340/426.25 |
| 5,724,024 A * | 3/1998 | Sonderegger et al. | 340/562 |
| 5,726,629 A | 3/1998 | Yu | 340/565 |
| 5,737,083 A | 4/1998 | Owechko et al. | 356/623 |
| 5,793,291 A | 8/1998 | Thornton | 340/573.1 |
| 5,796,094 A | 8/1998 | Schofield et al. | 250/208.1 |
| 5,802,479 A | 9/1998 | Kithil et al. | 701/45 |
| 5,805,056 A | 9/1998 | Mueller et al. | 340/426.24 |
| 5,808,552 A * | 9/1998 | Wiley et al. | 340/573.4 |
| 5,848,802 A | 12/1998 | Breed et al. | 280/735 |
| 5,859,479 A | 1/1999 | David | 307/10.8 |
| 5,887,466 A | 3/1999 | Yoshizawa | 70/257 |
| 5,914,610 A | 6/1999 | Gershenfeld et al. | 324/663 |
| 5,933,090 A | 8/1999 | Christenson | 340/825.69 |
| 5,938,321 A | 8/1999 | Bos et al. | 362/494 |
| 5,949,340 A | 9/1999 | Rossi | 340/573.1 |
| 5,986,549 A | 11/1999 | Teodorescu | 340/561 |
| 6,018,292 A | 1/2000 | Penny, Jr. | 340/426.29 |
| 6,024,388 A | 2/2000 | Tomah et al. | 292/216 |
| 6,028,509 A | 2/2000 | Rice | 340/449 |
| 6,051,981 A | 4/2000 | Gershenfeld et al. | 324/663 |
| 6,067,019 A * | 5/2000 | Scott | 340/573.4 |
| 6,086,131 A | 7/2000 | Bingle et al. | 296/76 |
| 6,091,322 A | 7/2000 | Ang et al. | 340/425.5 |
| 6,104,293 A | 8/2000 | Rossi | 340/573.1 |
| 6,130,614 A | 10/2000 | Miller et al. | 340/573.4 |
| 6,135,514 A | 10/2000 | Kowalewski et al. | 292/216 |
| 6,139,172 A | 10/2000 | Bos et al. | 362/494 |
| 6,166,625 A | 12/2000 | Teowee et al. | 340/426.26 |

| | | | |
|---|---|---|---|
| 6,209,933 B1 | 4/2001 | Ang et al. ................ 292/336.3 |
| 6,222,442 B1 | 4/2001 | Gager et al. ........... 340/426.29 |
| RE37,290 E | 7/2001 | David ....................... 307/10.8 |
| 6,254,261 B1 | 7/2001 | Bingle et al. ................ 362/501 |
| 6,275,146 B1 | 8/2001 | Kithil et al. ............. 340/425.5 |
| 6,335,687 B1 | 1/2002 | Terashima et al. ....... 340/573.1 |
| 6,339,376 B1 | 1/2002 | Okada ........................ 340/562 |
| 6,349,984 B1 | 2/2002 | Marrazzo et al. ........ 292/336.3 |
| 6,460,906 B2 | 10/2002 | Bingle et al. ............ 292/336.3 |
| 6,480,103 B1 | 11/2002 | McCarthy et al. ....... 340/425.5 |
| 6,485,081 B1 | 11/2002 | Bingle et al. ................. 296/76 |

FOREIGN PATENT DOCUMENTS

| GB | 2252438 A | 8/1992 |
| GB | 2266799 A | 11/1993 |
| JP | 58188458 | 12/1983 |
| WO | WO 9739920 | 10/1997 |
| WO | WO9813235 | 4/1998 |
| WO | WO9904119 | 1/1999 |

OTHER PUBLICATIONS

"Kit 62 Movement Detector Components", Sep. 24, 1994 p. 16.

Securaplane Technologies Product Information p. 2–3.

U.S. Publication No. 2002/0003571, published Jan. 10, 2002, for commonly assigned, co–pending U.S. patent application, Ser. No. 09/793,002, entitled Video Mirror Systems Incorporating an Accessory Module, filed Feb. 26, 2001 by Kenneth Schofield et al. (DON01 P–869).

* cited by examiner

VEHICLE COMPARTMENT OCCUPANCY DETECTION SYSTEM

CROSS-REFERENCE TO RELATED APPLICATIONS

The present application claims priority on U.S. provisional applications, Ser. No. 60/249,320, filed Nov. 16, 2000 for ELECTRIC FIELD COMPARTMENT SENSING SYSTEM; Ser. No. 60/310,344, filed Aug. 6, 2001 for VEHICLE COMPARTMENT OCCUPANCY DETECTION SYSTEM; and Ser. No. 60/326,373, filed Oct. 1, 2001 for VEHICLE COMPARTMENT OCCUPANCY DETECTION SYSTEM, which are all hereby incorporated herein by reference in their entireties.

FIELD OF THE INVENTION

The present invention relates generally to a system and method of detecting the presence of a person (or other living being such as a dog or cat or any other pet or animal) in a vehicle compartment such as a trunk or interior cabin compartment, and, more particularly, to an improved system and method for detecting the presence of a person in a vehicle trunk or passenger compartment. Specifically, the present invention comprises a vehicle compartment occupancy detection system that uses electric field sensing to detect the presence of a person in a vehicle compartment. Preferably, the present invention comprises a respiration detection system that includes a respiration transducer that uses electric field sensing to detect the presence of a person in a vehicle compartment.

BACKGROUND OF THE INVENTION

Entrapment of persons, particularly children, in vehicle compartments, such as interior cabins and trunks, is a known danger. A variety of solutions have been proposed such as those based on radar, ultrasonic, active and passive infrared, thermopiles, image sensors, carbon dioxide sensors, bolometers, and thermal imaging camera technologies. In addition, these sensors can be combined with other systems, such as pressure sensitive mats placed in the vehicle compartments and/or shock sensors, level sensors, and microphones. Many such prior occupant detection systems detect a movement, however, and such systems may fail to detect the presence of, for instance, a sleeping or moribund child. In the case of car-jacking victims or the like who are placed in the trunk of a vehicle while unconscious, the unconscious victim will be unable to activate a manual release handle and/or move so as to trigger a motion detector.

In addition, the interior compartment of a vehicle represents a danger to both humans and pets, particularly during hot weather. In the summer months, the interior temperature of a car can exceed 150 degrees Fahrenheit due to the greenhouse effect from the glass windows. Children, in particular, can suffer life-threatening illnesses, most notably heat stroke, when exposed to temperatures of this level. In some cases, parents will leave a sleeping child in a car for some period of time, rather than waking the child. Thus, there is a need for a system that can detect a sleeping or unconscious child to prevent tragedies at high temperatures.

SUMMARY OF THE INVENTION

The present invention is intended to provide a compartment occupancy detection system which is operable to detect the presence of a person or animal within a compartment, such as a trunk or cabin of a vehicle. The present invention is preferably operable to generate an electric field in a portion of a vehicle compartment and detect respiration or movement of a person or animal within the compartment by detecting a change in an electric field established within the compartment being monitored. The present invention may be further operable to actuate an accessory of the vehicle and/or to communicate an alert to a person remote from the vehicle in response to a detection of a person within the vehicle compartment and a detection of a hazardous condition within the vehicle compartment.

According to an aspect of the present invention, a vehicle compartment occupancy detection system for detecting the presence of a person in a vehicle compartment includes at least one electric field sensor which is operable to detect occupancy in the vehicle compartment by detecting a change in an electric field within the compartment; the change in the electric field being indicative of a presence of a person within the compartment. Preferably, the change in the electric field is indicative of a biometric characteristic of a person, and, more preferably, the change in the electric field is indicative of respiration of a person or animal within the vehicle compartment. The sensing system may be positioned within a cabin or trunk compartment of the vehicle.

In one form, the vehicle compartment sensing system includes at least one electric field generator which is operable to generate the electric field within the vehicle compartment. The electric field generator may include at least one transmitting electrode, while the electric field sensor may include at least one receiving electrode. In another form, the electric field sensor may be further operable to generate the electric field within the vehicle compartment.

In one form, the vehicle compartment sensing system further includes a microprocessor which is operable to receive a signal from the electric field sensor and to receive at least one input and/or to output at least one output. The output may be in response to the input being indicative of a hazardous condition within the vehicle compartment and of a person being detected within the vehicle compartment. The output may be a corrective action to at least partially alleviate the hazardous condition and/or a communication to communicate to a person exteriorly of the vehicle that the hazardous condition exists. The output may include a communication with a remote receiver, activation of a ventilation system of the vehicle, actuation of at least one of a horn or a light of the vehicle, activation of a security system, unlocking of the doors of the vehicle, opening of at least one window of the vehicle, and activation of a remote transducer. The input may include a temperature input indicative of a temperature within the vehicle compartment, a door lock status, a door position, a window position, a vehicle motion status, an ignition position, a signal from a radar detector within the vehicle compartment, a signal from an ultrasound detector within the vehicle compartment, a signal from an imaging detector within the vehicle compartment, a signal from a carbon dioxide detector within the vehicle compartment and/or a signal from a carbon monoxide detector within the vehicle compartment.

Optionally, the vehicle compartment sensing system may include a timer. The sensing system may be operable to monitor the electric field sensor for a period of time following an activating event, such as receiving a signal which is indicative of a person exiting the vehicle, and then to deactivate at the end of the period of time.

According to another aspect of the present invention, a vehicle compartment sensing system for detecting the presence of a person in a vehicle compartment includes at least one electric field generator which is operable to generate a electric field within the compartment, at least one electric field sensor which is operable to detect the electric field within the vehicle compartment, and a control which is operable to determine occupancy of the vehicle compartment in response to a change in the electric field being detected by the electric field sensor. The change in the electric field being indicative of respiration of a person within the vehicle compartment.

Preferably, the control is operable to actuate at least one accessory in response to the detected change in the electric field. The control may further be operable in response to at least one input, whereby the control is operable to actuate at least one accessory in response to the change in the electric field and the input. The accessory may include at least one of a communication system, a security system, a door lock system of the vehicle, a window of the vehicle, a ventilation system of the vehicle, an air conditioning system of the vehicle, a heater of the vehicle, a light of the vehicle and a horn of the vehicle.

According to another aspect of the present invention, a method for sensing the presence of a person in a vehicle compartment includes providing at least one electric field sensor at the vehicle compartment, and sensing a change in an electric field within the vehicle compartment which is indicative of a presence of a person within the vehicle compartment.

Preferably, the method includes sensing at least one vehicle characteristic and actuating at least one accessory in response to the vehicle characteristic and the electric field sensor. The vehicle characteristic may be one or more of a temperature within the vehicle compartment, a door lock status, a door position, a window position, a vehicle motion status, an ignition position, a signal from a radar detector within the vehicle compartment, a signal from an ultrasound detector within the vehicle compartment, a signal from an imaging detector within the vehicle compartment, a signal from a carbon dioxide detector within the vehicle compartment and a signal from a carbon monoxide detector within the vehicle compartment.

These and other objects, advantages, purposes and features of the present invention will become apparent upon review of the following specification in conjunction with the drawings.

DESCRIPTION OF THE PREFERRED EMBODIMENTS

Figure 1A:
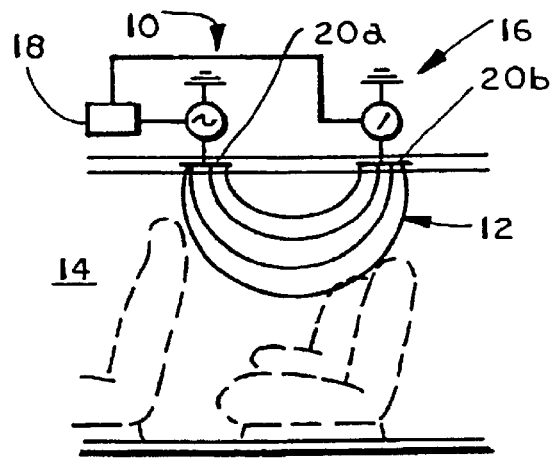
FIGS. 1A and 1B are side elevations of a vehicle compartment occupancy detection system in accordance with the present invention.

The present invention involves generation of an electric field that encompasses a portion or a whole of a vehicle compartment volume where an entrapped person such as a sleeping child may be found. An example of such an electric field generating system is disclosed in U.S. provisional applications, Ser. No. 60/249,320, filed Nov. 16, 2000 for ELECTRIC FIELD COMPARTMENT SENSING SYSTEM; Ser. No. 60/310,344, filed Aug. 6, 2001 for VEHICLE COMPARTMENT OCCUPANCY DETECTION SYSTEM; and/or Ser. No. 60/326,373, filed Oct. 1, 2001 for VEHICLE COMPARTMENT OCCUPANCY DETECTION SYSTEM, which are hereby incorporated herein by reference. Because of a person's dielectric and conductive properties, the presence of a body or body part influences the electric field generated in the vehicle compartment; the influence being at least dependent on: (1) how much of the field is intercepted by the person, (2) the size of the person, (3) the relative grounding of the person, and (4) the proximity of the person to the electrodes.

The dielectric and conductive properties of a person are characteristic of a person and are distinct from the dielectric and conductive properties of other objects, such a groceries, plastics, debris, etc., which may be found in the vehicle compartment. Hence, the change in the electric field induced by the presence of a person is distinct from the change in the electric field induced by other objects. However, the influence of an object on the electric field is also dependent upon how much of the field is intercepted by the object, along with the size of the object and the proximity of the object from the electrodes. Thus, it is possible for an object having capacitive properties which are very different from those of a person to affect the electric field in a manner which closely resembles, say, the upper torso of a person.

A characteristic of human presence, however, is that a living being has to breathe. The act of respiration affects an electric field in a way that is not easily emulated by an inanimate object regardless of the object's size, positioning within the field, or its proximity to the electrodes. During inspiration, the thorax (i.e., chest region) and abdomen expand through the muscle action of the diaphragm and rib cage (thus, also expanding the lungs), allowing air to flow in.

During expiration, the reverse sequence occurs and as the diaphragm and rib cage relax, air is forced out, and the circumference of the chest and abdomen contract. Thus, when a person is present in an electric field, the involuntary mechanical act of breathing changes the amount of the field that is intercepted by the person in a characteristic rhythmic pattern. In normal breathing, the rhythmic pattern of inhalation and exhalation (i.e., breathing rate) occurs about 30–50 times/min in infants; about 18–30 times/min in children; and about 8–18 times/min in adults.

Referring now to the drawings and the illustrative embodiments depicted therein, an occupancy detection system 10 is operable to detect and distinguish the changes in an electric field 12 induced by a biometric characteristic, such as respiration, and, hence, detecting the presence of a person or animal 13 in a vehicle compartment (such as an interior cabin or a trunk) 14 using a specially designed electric field sensing device and pattern detection algorithm. The occupancy detection system of the present invention includes at least one transducer 16 (preferably, an electric field sensing transducer), a microprocessor-based control 18 (preferably a digital signal processor comprising a microcomputer having a data processing speed of at least about 4 millions of instructions per second (MIPS), more preferably of at least about 12 MIPS, and most preferably of at least about 22 MIPS) and software that provides a biometric characteristic detecting system and, preferably and more specifically, provides a respiration detecting system. Preferably, the compartment sensing system of the present invention is capable of detecting a sleeping infant under a blanket in a baby seat on a back seat of an automobile or similar vehicle.

Electric Field Sensing System

Figure 1B:
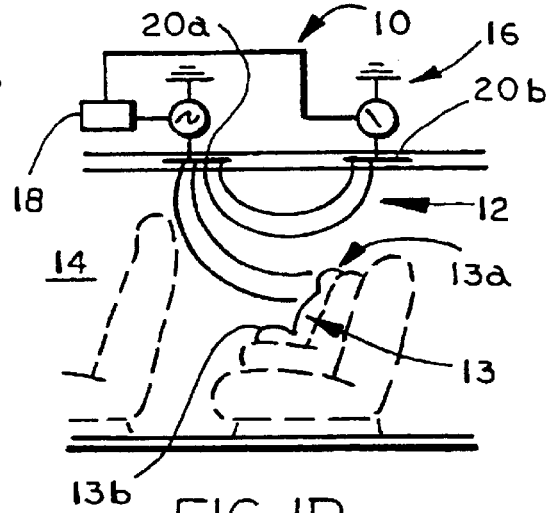

As shown in FIGS. 1A and 1B, occupancy detection system 10 locates at least one transmit electrode 20a and at least one receive electrode 20b in the vehicle compartment 14 (such as the interior cabin of an automobile). Careful design and placement of the electrodes 20a, 20b ensures that the electric field 12 extends into the target area(s). The electrodes 20a, 20b may be easily integrated into many different automotive components. For example, two adjacent spaced electrodes may be mounted in the headliner (as shown in FIGS. 1A and 1B). In this configuration, a 3-dimensional ellipsoidal dipole-like electric field 12 may be established between an oscillator electrode (transmitter) 20a and a virtual ground electrode (receiver) 20b. As shown in FIG. 1B, the upper portion 13a of a person 13 intercepts the fringing electric field 12 and the lower portion 13b of the body is out of the field and relatively "grounded." The presence of a body in the electric field shunts displacement current to ground. The amount of displacement current that is shunted by the person is proportional to how much of the electric field volume is intercepted by the person; the larger the amount of field intercepted, the more displacement current shunted to ground.

As a person breathes in and out, the volume of electric field intercepted by the body rhythmically increases and decreases. Concurrently, the amount of displacement current being shunted to ground increases and decreases. This leads to a characteristic modulation in the displacement current at the receiver.

Figure 2:
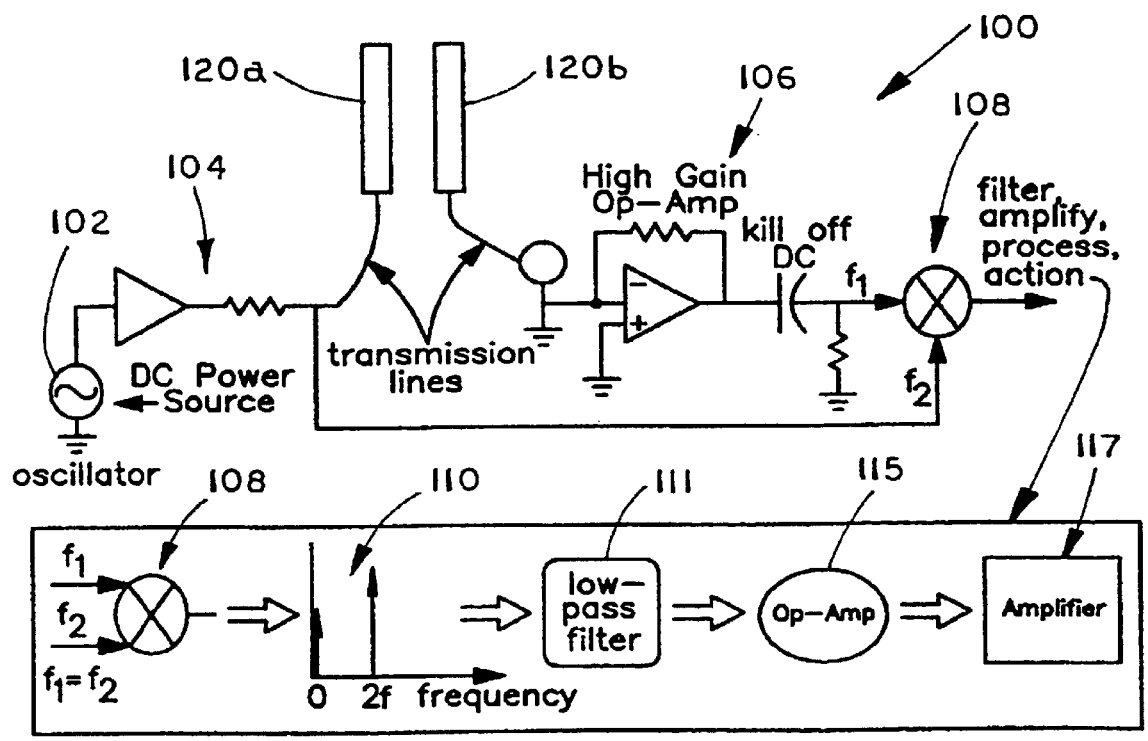
FIG. 2 is a schematic of a vehicle compartment occupancy detection system in accordance with the present invention.

Referring now to FIG. 2, the salient features of an electric field sensing system 100 that may be used to detect this displacement current modulation, and hence detect the presence of a person, are shown. Particularly, a power source 102 is operable to generate an AC signal, which is amplified via amplification circuitry 104 and creates a voltage between an oscillator electrode (transmitter) 120a and a virtual ground electrode (receiver) 120b. This potential difference induces charge on the electrodes, thus creating an electric field (not shown in FIG. 2) between the electrodes. The virtual ground is an electrical connection kept at zero potential by an operational amplifier 106, which allows the displacement current to ground [at the receiver] to be measured.

The signals $f_1$, $f_2$ from the amplification circuitry 104 and from the operational amplifier 106, respectively, are received by a synchronous demodulator 108, which processes the signals to result in a two component output signal 110, one component having zero frequency and one component having a frequency of twice the input frequency or 2f. The output signal is passed through a low pass filter 111, which eliminates the 2f component and passes the zero frequency or DC component and frequencies which are close to the DC component. Such frequencies include very low frequency signals which are indicative of a respiration signal. An operational amplifier 115 then subtracts the DC component which results in the low frequency respiration signal being communicated to an amplifier 117 to amplify the respiration signal.

The operating frequency for this system should be low enough so that the size of the transmit electrode 120a is only a very small fraction of the wavelength. This ensures that no appreciable energy is radiated. Further, the operating frequency must be large enough so that displacement currents are of measurable magnitudes. A desirable operating frequency range is between about 10 and 100 kHz; more preferably between about 20 and 80 kHz; and most preferably between about 30 and 60 kHz. The system of the present invention thus includes a respiration detector element. The system could accomplish this using an algorithm that detects human presence from other signals in the electric field detector's output based on the characteristic frequency of respiration of a human (or other animal or living being or mammalian, such a dog or cat).

Figure 3:
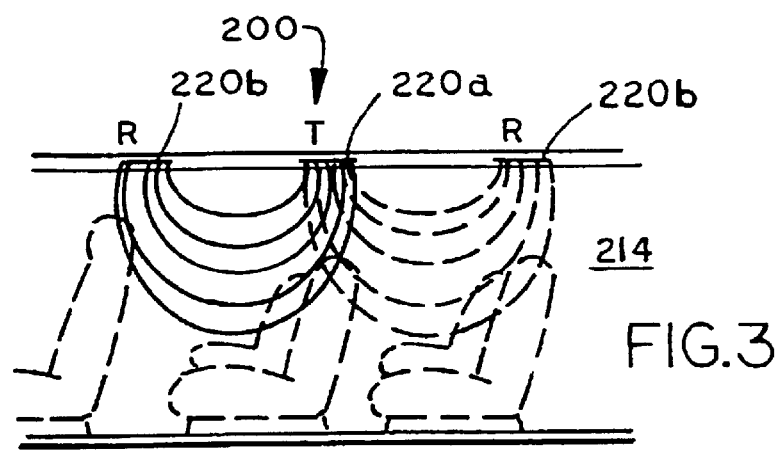
FIG. 3 is a side elevation of another vehicle compartment occupancy detection system in accordance with the present invention.

In the design of the electric field sensor, the location and geometry of the electrodes determines the volume of the vehicle that can be monitored. A larger vehicle interior cabin, such as that of a sport utility vehicle or van, would likely require a different electrode configuration as compared to a small sedan. FIG. 3 shows an occupancy detection system 200 for a larger vehicle having a larger compartment 214. Occupancy detection system 200 includes an electrode configuration with a transmitting electrode 220a and two receiving electrodes 220b. To economize the power consumption, the occupancy detection system 200 may be alternately pulsed between front and rear electrode pairs.

It is further envisioned that the electrodes may otherwise be positioned within the compartment. For example, one electrode can be located in an upper compartment portion (such as a roof area such as the headliner) and another in a lower compartment portion (such as in the seat, floor area, baby seat, etc). Additional placements of the electrodes can be imagined by one skilled in the art and implemented without affecting the scope of the present invention.

Figure 4:
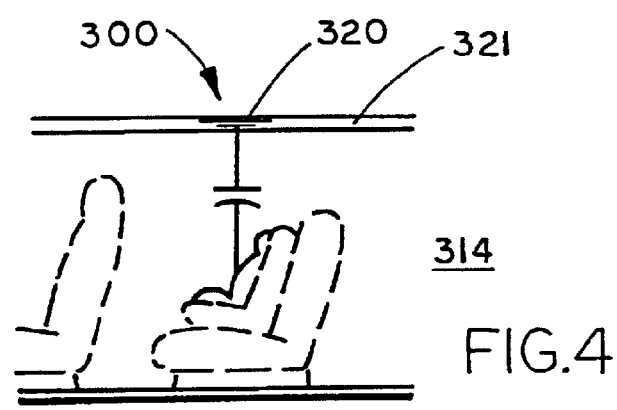
FIG. 4 is a side elevation of another vehicle compartment occupancy detection system in accordance with the present invention.

As shown in FIG. 4, another embodiment of an occupancy detection system 300 of the present invention locates a single electrode 320 in a vehicle compartment 314. Using capaciflector or shielding technology (such as disclosed in U.S. Pat. No. 5,166,679, the entire disclosure of which is hereby incorporated by reference herein), the single electrode 320 can be placed in the headliner portion 321 of the vehicle to monitor the area beneath it. Multiple single electrode systems can be used to monitor several vehicle compartment sub-volumes simultaneously. Additionally, a larger single electrode system can be designed to cover a larger volume of the vehicle.

Figure 5:
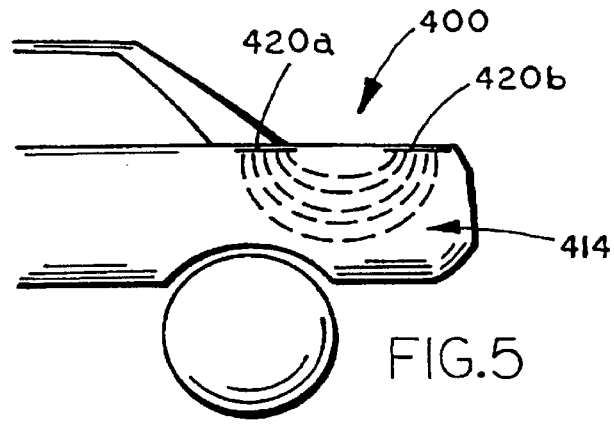
FIG. 5 is a side elevation of another vehicle compartment occupancy detection system in accordance with the present invention, with the system being positioned within a trunk compartment of a vehicle.

In yet another embodiment, an occupancy detection system 400 is placed in the trunk compartment 414 to detect victims of crime or young children (see FIG. 5). The occupancy detection system 400 may include one or more electrodes for monitoring the compartment and detecting a person or animal within the compartment. For example, as shown in FIG. 5, a transmit electrode 420a and a receive electrode 420b may be positioned within the trunk compartment to monitor the trunk compartment 414.

Additional System Inputs/Outputs

It is envisioned that the occupancy detection system of the present invention may include at least one temperature input. The temperature can be measured by means of a thermometer, thermopile, thermocouple, zener diodes, active infrared sensors and the like. Additionally, the temperature inputs can be fed through the vehicle body computer from existing devices of the vehicle already in place. The temperature input from the system may be used to have the system respond in a pre-determined manner when the temperature reaches dangerous levels (either hot or cold; for example, greater than about 40 degrees Celsius or lower than about 5 degrees Celsius). The system may be configured to provide an output in response to the temperature input reaching a threshold value. For example, if the system determines that the vehicle temperature is dangerously hot and there is a person present in the vehicle, the system could be configured to take one or more of the following actions:

1. Establish contact with OnStar or another telematics, remote telecommunication system or via a cellular phone link;
2. Start the ignition and turn on HVAC system of the vehicle;
3. Beep the horn (preferably in a coded sound pattern that signals a hazard condition such a "SOS" in Morse code);
4. Activate a security system of the vehicle;
5. Unlock the doors of the vehicle;
6. Open/roll down the windows of the vehicle;
7. Dial 911 from an in-car cell phone;
8. Send an image of the vehicle interior to an OnStar operator or the like;
9. Flash the headlamps;
10. Activate the key fob; and/or
11. Call the vehicle owner cell phone or the like.

A challenge with electric field type sensors is parasitic capacitance. It is important to limit stray capacitances as much as possible so as to retain the desired strength and shape of the electric field. One way to minimize parasitic capacitance, which is known in the art, is by shielding technology such as that used for capaciflector type sensors. This technology can be incorporated into any of the above-mentioned embodiments of the present invention.

To account for different vehicle interior sizes and configurations, the electronic circuitry (which preferably includes a microprocessor or microcomputer) incorporated into the electric field sensing occupancy detection system establishes a baseline field under normal conditions, i.e., when the vehicle cabin or trunk is empty. Alternatively, the electronic circuitry incorporated into the electric field sensing occupancy detection system includes a predetermined baseline field derived, for example, from models of each different vehicle interior using computer simulation techniques.

To minimize false alarms and/or nuisance alarms, a smart key fob system can be used. Key fobs are commonly known in the automotive arts, and typically are a hand-held fob device that the driver carries in his or her pocket or purse for use, for example, for key-less unlocking/locking of vehicle doors when approaching or when walking away from the vehicle. For example, if after exiting the vehicle, the system of the present invention detects a positive signal, the user's key fob could chirp. If the user determines that it is a false alarm he could deactivate the system. Alternatively, if the positive signal is from a child or pet being in the vehicle, the user could leave the in-vehicle occupancy detection and hazard reduction system of the present invention activated and simply have it respond if the vehicle interior gets too hot or cold as prescribed by predetermined temperature extremes.

Additional logic may be added to the system to improve its effectiveness. For example, there may be situations when the car is parked and the ignition is off, but the driver remains in the car, and, therefore, the system does not need to be activated. For this case, the system could receive inputs from the driver's door module to determine if he or she has departed from the vehicle.

It is not uncommon for a driver to leave a child or pet in a locked vehicle cabin while shopping or the like, with the intention of returning soon. To cater to such a circumstance, the electric field occupancy detection system of this invention may include a dynamic hazardous condition detection system that determines whether a hazardous condition exists before taking corrective action. For example, should the electric field occupancy detection system determine that the vehicle is not in motion, that the engine is not running, that at least one window is open (or at least significantly open), that the cabin temperature is outside a life threatening range (such as below about 40 degrees Celsius and above about 5 degrees Celsius) and that there is a person in the interior cabin of the vehicle, then the dynamic hazardous condition detection system may determine that a hazardous condition may not exist at that time. However, if similar conditions still exist after elapse of a further time period (for example, 30 minutes or 60 minutes), then the dynamic hazardous condition detection system determines that a hazardous condition exists and a hazard alert is activated and/or corrective action is taken. However, if, for example, the electric field occupancy detection system determines that the vehicle is not in motion, that the engine is not running, that all windows are closed, that the cabin temperature is climbing towards a life threatening range (such as above about 40 degrees Celsius), that there is a person in the interior cabin of the vehicle, and that this condition is persisting beyond some predetermined period (such as 10 minutes or so), then the dynamic hazardous condition detection system may determine that a hazardous condition exists and activate a hazard alert and/or take corrective action. The thresholds and/or wait periods before action is taken dynamically vary with the conditions, and their severity, being sensed in the vehicle cabin.

The electric field occupancy detection system of the present system may receive inputs from a variety of occupancy detecting sensors in addition to an input from a field sensor. Such additional sensors may include a thermal or pyrodetector, a radar detector, an ultrasound detector, a video camera or similar imaging detector, a carbon dioxide and/or carbon monoxide detector, or their combination.

The electric field occupancy detection system of the present invention, including its associated circuitry, preferably has power consumption less than about 0.5 watts, more preferably less than about 0.25 watts, and most preferably less than about 0.1 watts. For a 12 volt battery supply in the vehicle, the current consumption by the system is preferably less than about 25 milliamps, more preferably less than about 10 milliamps, and most preferably less than about 1 milliamp (for a 42V supply in the vehicle, currents may be lower, preferably by at least one quarter). However, the electric field vehicle compartment occupancy detection system of the present invention may have power consumption greater than about 0.5 watts and current consumption greater than about 25 milliamps, particularly for a predetermined time period (such as 30 minutes to 120 minutes or even longer) after the system is first armed (which can be when the vehicle ignition is turned off and a door is opened and closed, and locked). Once this initial period times out and no person is detected, then the system can go into a disabled or sleep mode until rearmed; the logic being that if a hazardous condition is not detected (and a person's presence is not detected) within some defined period after the vehicle is parked, then the vehicle is long-term parked with no living being such as a person or pet present in the interior cabin, and the monitoring system can shut down so as not to run down the vehicle battery while parked for a prolonged period.

Also, should the electric field occupancy detector detect the presence of an occupant such as a sleeping child, then, optionally, a sound, such as from a horn or the like, can be actuated in the vehicle cabin to wake the sleeping child, and a motion-sensitive auxiliary occupancy detector can be actuated to confirm that indeed a child is present in the vehicle.

Also, there have been occurrences when a child has entered a vehicle and locked himself or herself into the vehicle (such as by actuating the central locking feature now common on vehicles). The system of the present invention can monitor the interior cabin and take appropriate actions when the system determines a hazardous condition exists.

It is further envisioned that the vehicle compartment occupancy detection system of the present invention can also be used as an intrusion sensor to protect the vehicle from theft or vandalism. For example, a multi-mode system of the present invention can be provided comprising at least two modes: one which functions as a vehicle intrusion sensor and one which functions as a child safety sensor. In one embodiment, the system acts as an intrusion sensor at all temperatures and only acts as a child safety sensor at dangerously high or low temperatures. During intrusion sensor operations, the system would activate the vehicle alarm, whereas the system may take additional actions when the system detects that a person or child may be in danger. In such a dual- or multi-mode operation, the signal output by the multi-mode system indicative of a vehicle intrusion may have characteristics distinct and different from the signal output characteristic of respiration (and the respective associated amplification circuitry and algorithms may also be different).

Field Sensing System Analysis

An electric field vehicle compartment occupancy detector in accordance with the present invention was fabricated (the EFS electric field sensing circuit) and evaluated to establish effectiveness in distinguishing a person from other inanimate objects that might occupy a vehicle interior cabin. The EFS circuit effectively establishes a large capacitor in the region being sensed and measures an induced current through this capacitor. EFS circuits are known in the art, such as are disclosed in U.S. Pat. Nos. 6,051,981 and 5,914,610, the entire disclosures of which are hereby incorporated by reference herein. Objects such as a person or animal in the vicinity of this large capacitor will either increase or decrease the net current from one plate of the capacitor to the other. Various objects including children and items likely to be transported in a car were tested in a simulator of an interior vehicle cabin portion. It was found that the EFS circuit is effective at determining that an object is near it but this approach alone has limited ability to determine the composition of that object.

Figure 6:
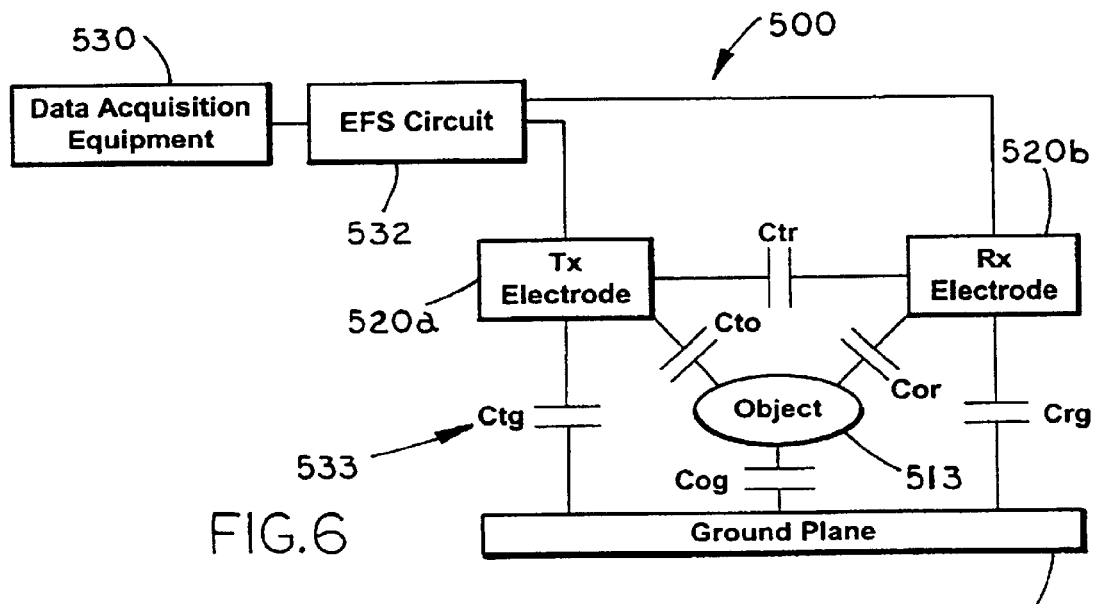
FIG. 6 is a block diagram of a vehicle compartment occupancy detection system in accordance with the present invention.
Figure 7:
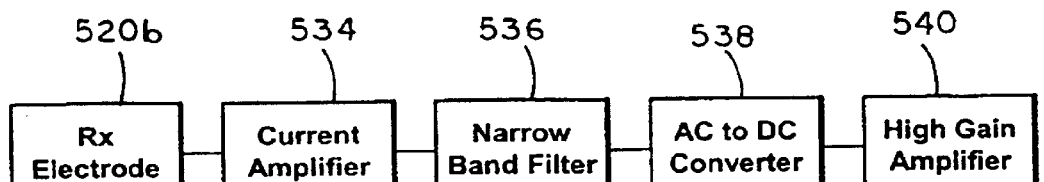
FIG. 7 is a schematic of the electronic components useful with a receiving transducer in accordance with the present invention.

Referring to FIG. 6, a circuit model 500 of the type tested including the signal transmission path includes data acquisition equipment 530, an EFS circuit 532 and a transmitting electrode 520a and a receiving electrode 520b. A sine wave of approximately 60 KHz is generated at the transmit plate or electrode 520a by a low output impedance amplifier. This signal then propagates through the capacitive network, shown generally at 533, and into the receive amplifier (not shown in FIG. 6). The capacitive network 533 shows the capacitance between the transmit electrode 520a, the receive electrode 520b, an object 513 and a ground plane 535 for the signals from the transmit electrode to the receive electrode. As shown in FIG. 7, the receive electronics signal chain includes the receiving electrode 520b, a current amplifier 534, a narrow band filter 536, an AC to DC converter 538 and a high gain amplifier 540. This is a simplified view of the electronics. In reality, the narrow band filter 536, AC to DC converter 538 and high gain amplifier 538 are made up of a synchronous demodulator and a low pass filter, similar to those shown in FIG. 2 and discussed above.

Ideally, there is no input resistance to the current amplifier 534 and the receive electrode 520b is grounded. In such an ideal configuration, any parasitic capacitance to ground in the receive circuit would not effect the received signal. However, in an actual installation in a vehicle cabin or trunk compartment, there is likely to be a resistance between ground and the receive plate. Should this be the case, the receive electrode 520b is not at a ground potential. The voltage on the receive plate induces a current to ground through any parasitic capacitances and the output of the current amplifier is degraded by these currents.

It can now be seen how an object can increase or decrease the received signal. If the object has a large capacitance or small resistance to ground, it tends to defray current from the receive electrode 520b to ground. This causes a reduction in the received signal (Shunt Mode). If the object has a small capacitance to ground with respect to the other capacitances in the circuit and a large resistance to ground, it will tend to add to the capacitance between the plates. If the object is a dielectric, it does this by having a dielectric constant greater than that of air. If the object is a conductor, the effective distance between the plates is reduced, thus increasing the plate-to-plate capacitance (Transmit Mode).

The output of the EFS circuit is a dc voltage. It is not unusual for this output voltage to have a drift rate of up to 100 mV per minute. The drift tends to be centered on a fixed value and typically will not leave that fixed voltage by more than about 1 Volt per hour. It has been found that repeatable measurements can be made as long as they are taken within a short time frame. It is also possible to monitor drift by taking empty system baselines before and after the measuring of an object, without affecting the scope of the present invention.

During testing of occupancy detection system 500, a small bucket of water was measured a total of 15 times to get an idea of the repeatability of the measurements. The measurements where made in 3 sets with 5 measurements per set. The first and second set was separated by 2 hours and the third set was taken the following day. The data were taken on an object that had a small effect on the field to simulate a worst-case scenario. Analysis of the data shows that ± one standard deviation is equal to about 5 mV. This shows that the system may not be outstanding at reading small objects repeatedly but it has utility for coarser discrimination of larger items in a vehicle compartment.

The data were collected by recording a reading before the object was in the field, a reading when the object was in the field, and a reading after the object was removed from the field. Care was taken to remove any external influences, such as the location of people and equipment with reference to the electrodes. All measurements were taken with the objects elevated off the ground-plane 535. Three different levels of height were tested. The heights of 1, 4 and 7 inches were obtained by inserting Styrofoam sheets between the ground-plane and the object. A variety of objects were tested. For example, three children were first measured. After the children, different groceries, metal and nonmetallic objects were measured.

The children tested ranged in age from 1 to 5 years old and gave readings that varied between −2.7 and −8.8 volts. Thus, the presence of children was generally well discriminated, although there were a few objects that also fell in that range, namely, an 18 lb. bag of grapefruit (−3.96 volts); a metal sheet (−3.48 volts); a bag of groceries (containing canned goods, a box of crackers and bag of potato chips) (−4.05 volts); and two bags of groceries (the first being already mentioned and the second containing a 12 pack, two 2 liter bottles and a bag of oranges) (−5.24 volts).

From the test results, it was discovered that most all of the objects tested act in shunt mode. One notable exception is that a metallized mylar balloon had a reading of 6.75 Volts. The balloon has an extremely strong transmit mode behavior. When the bag of grapefruit, which had a reading of −3.96 Volts on its own, was combined with the balloon, a reading of 3.05 was recorded. This shows how the grapefruit was able to shunt away current from the receive electrode and reduce the measurement. The effects of superposition on the system can be seen from this and the grocery bags. The effect of the styrofoam sheets was to decrease the object to ground capacitance. This caused the reading to move to more positive values or to more of a transmit mode.

The EFS circuit is thus a good representative of a fixed frequency capacitive proximity sensing device that is suitable for determining that an object is near the sensor while being inadequate to fully distinguish what type of object is being sensed.

Microprocessor-Based Vehicle Interior Occupancy Sensing System

Figure 8:
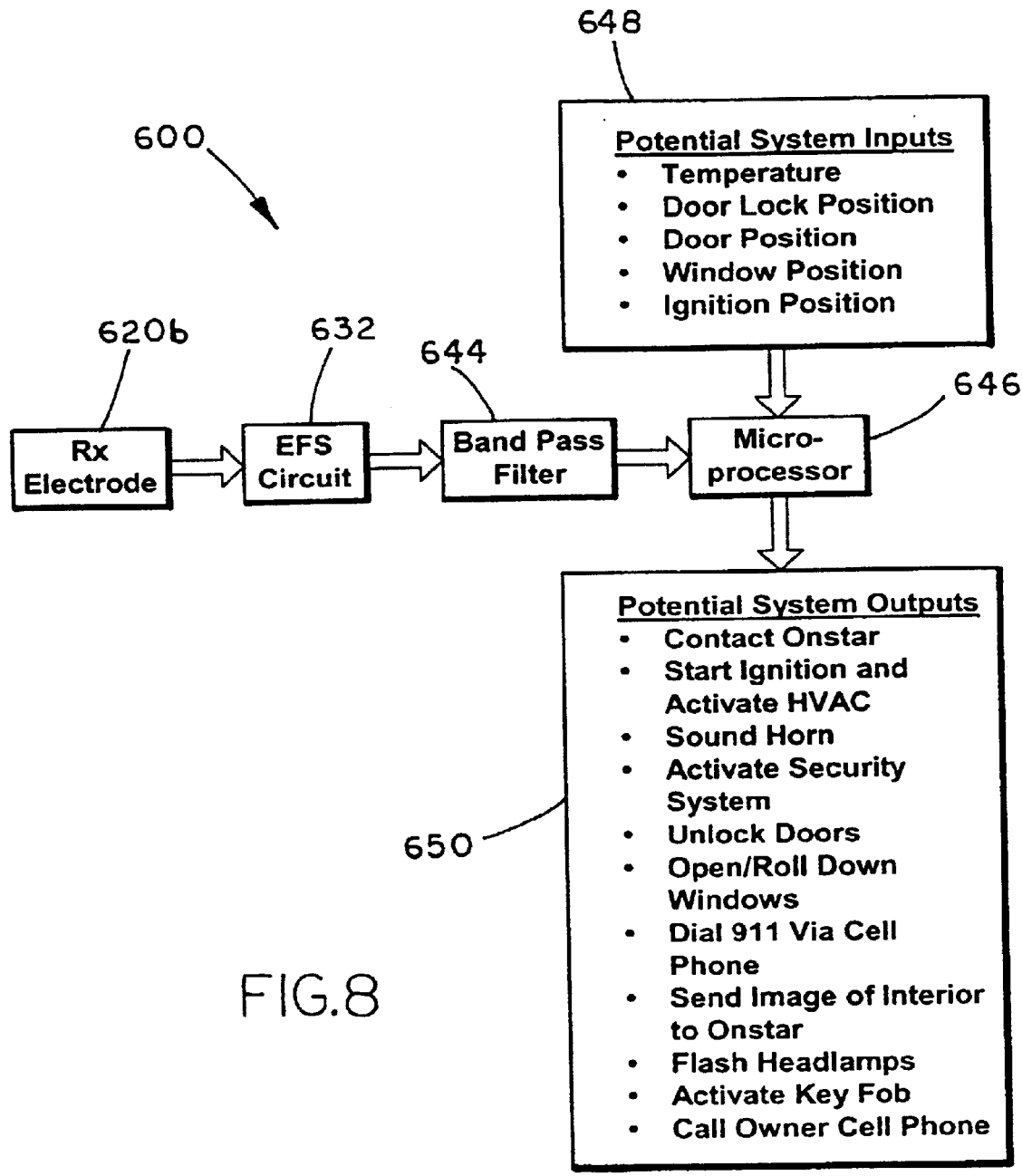
FIG. 8 is a block diagram of a microprocessor-based occupancy detection system in accordance with the present invention.

An improvement to the electronic field sensing circuit involves the addition of bandpass filtering and a microprocessor-based or microcontroller-based system to detect the frequency signature of respiration. Referring to FIG. 8, a micro-based system 600 may also manage the input and output of a number of signals to and from the vehicle. This system generates more information about an object being sensed than just proximity by using an algorithm to identify the unique frequency signatures of different objects. For example, micro-based system 600 may include a receiving electrode 620b, EFS circuit 632, a band pass filter 644 and a microprocessor or microcontroller 646. The microprocessor 646 receives a signal from receiving electrode 620b and from one or more system inputs 648, such as a temperature input, a door lock position or status, a door position (open, closed, or ajar), a window position, an ignition position and/or the like. The microprocessor 646 is then operable to perform, generate or actuate one or more system outputs 650, such as (i) contact OnStar, (ii) start the ignition and activate the HVAC (heating, ventilation and air conditioning) system of the vehicle, (iii) sound the horn, (iv) activate a security system of the vehicle, (v) unlock the doors, (vi) open or roll down the windows, (vii) dial 911 via a cell phone of the vehicle, (viii) send an image of the interior of the vehicle to an OnStar operator or the like, (ix) flash the headlamps, (x) activate the key fob, (xi) call the vehicle owner via their cell phone or the like, and/or any other system output for signaling a hazardous condition, communicating a hazardous condition to the owner of the vehicle, correcting a hazardous condition and/or the like.

Multi-Electrode Sensing System

A simulation of an interior cabin of a vehicle was also established in a test facility and equipped with a compartment occupancy system of the present invention. The dimensions of the simulated vehicle compartment were approximately 36 inches wide by 36 inches long by 30 inches tall. A pair of aluminum electrodes, each electrode being approximately 8 inches wide by approximately 18 inches long, was placed on an upper or top plate facing into the simulated vehicle compartment. The electrodes were adjacent and spaced apart 18 inches center to center. Each electrode was connected to an electric field (EF) sensing circuit via a 6 foot length of coaxial cable. To test the effectiveness of the vehicle compartment occupancy system of the present invention in detecting human respiration, an adult female lay on her back in the simulated vehicle compartment with her thoracic region positioned about 22 inches below, and facing, the electrode pair.

Figure 9A:
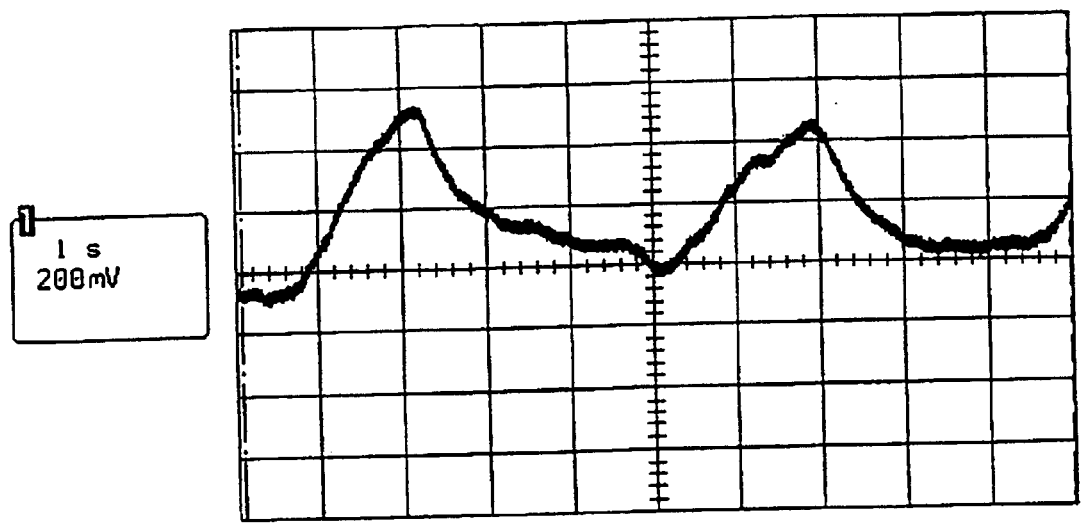
FIGS. 9A and 9B are graphical representations of a signal detected by the occupancy detection system of the present invention, the signal being representative of an adult breathing.
Figure 9B:
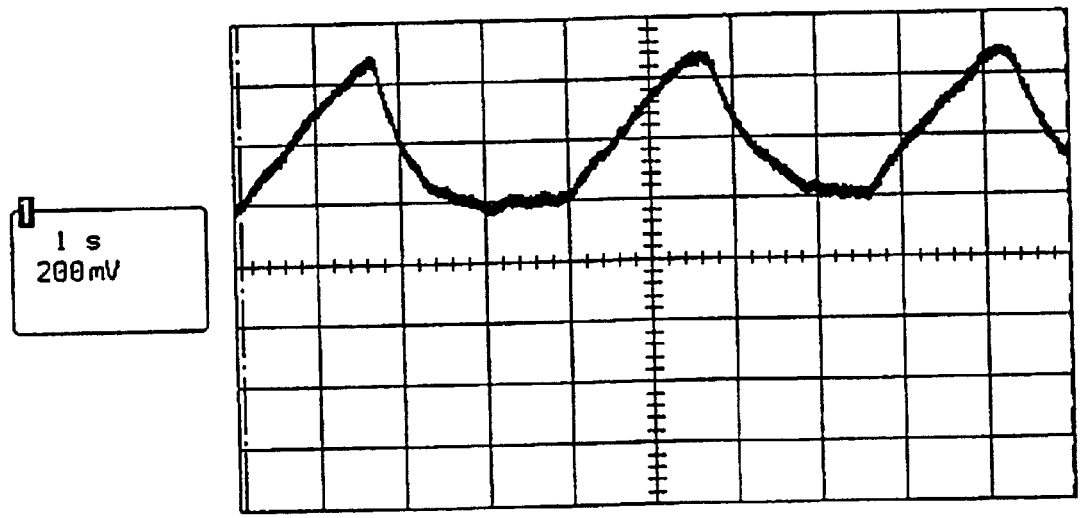

When a person intercepts the impinging electric field, as described above, the body's capacitive and conductive properties serve to shunt displacement current within the circuit used to ground, thus reducing the amount of displacement current reaching the receive electrode. During human respiration, the amount of displacement current shunted to ground, and hence the amount of displacement current reaching the receive electrode, is modulated in a characteristic pattern. The output of the EF circuit transforms this physical modulation of a body into a corresponding voltage modulation. FIGS. 9A and 9B show a typical output of the EF circuit in response to the experiment described above, wherein a female adult's respiration was detected. The y-axis shows voltage (Volts) and the x-axis is time (seconds). As seen in FIGS. 9A and 9B, the period associated with a respiration signal is approximately 3 seconds and the amplitude is approximately 400 millivolts.

Figure 10:
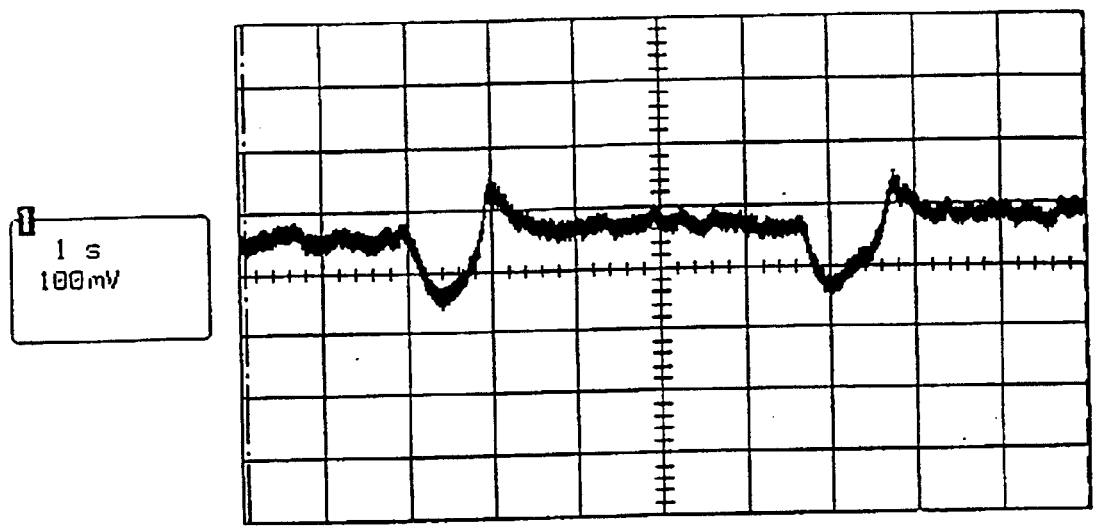
FIG. 10 is a graphical representation of a signal detected by the occupancy detection system of the present invention for a simulated person within a compartment.

During testing of the system, a 5.2 lb pork loin was moved inside the simulated vehicle compartment to simulate a child's breathing. A pork loin was chosen for the simulation experiments because its chemical composition is similar to that of a person's (i.e. bone, blood, water, fat, etc.). The pork loin was placed at the bottom of the simulated compartment and repetitively and rhythmically moved approximately one inch up and back down (this was done using a plastic shovel that did not itself disturb the electric filed between the electrodes). The signal from this child occupancy simulation can be seen in FIG. 10. The pattern differs from the breathing signal detected for the adult in that its magnitude is much smaller. These differences can be attributed to the motion of the loin and its smaller size. Again, the y-axis shows voltage (Volts) and the x-axis is time (seconds). The period associated with the simulated respiration signal is approximately 5 seconds and the amplitude is approximately 200 millivolts. The simulation demonstrates that the system of the present invention is capable of detecting movement of smaller mass bodies.

Figure 11:
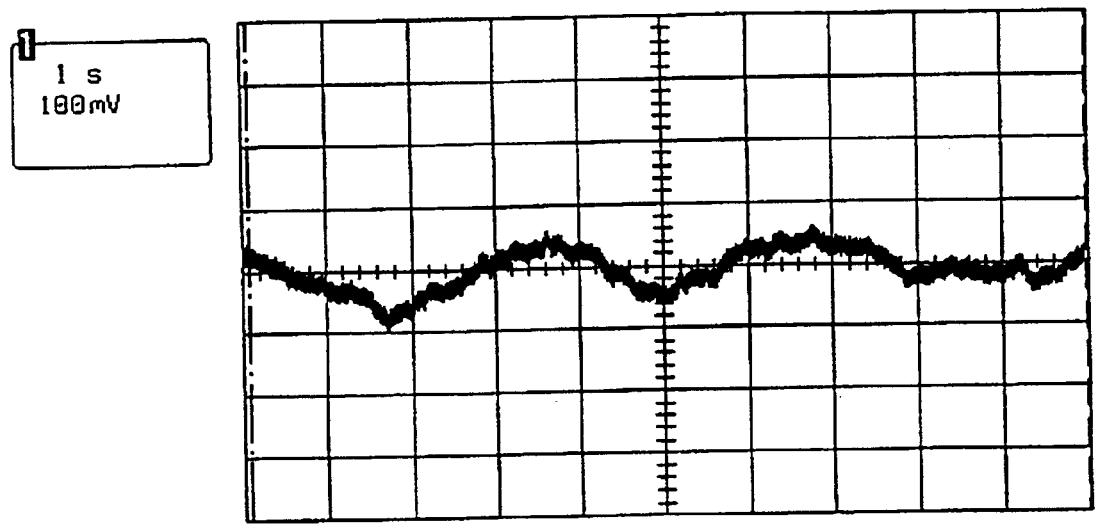
FIG. 11 is a graphical representation of a signal detected by the occupancy detection system of the present invention for an infant.

Additionally, a 6-month old infant weighing approximately 17 lbs was placed in the simulated vehicle compartment. The infant was positioned to be laying in a car seat directly in the center of the vehicle compartment simulator. The breathing signal of the infant can be seen in FIG. 11. The waveform shown in FIG. 11 resembles that shown in FIGS. 9A, 9B, which show the respiration signal of the adult female. The period of the respiration signal shown in FIG. 11 is about 3 seconds and the amplitude is approximately 150 millivolts.

Single Electrode Sensing System

Figure 12:
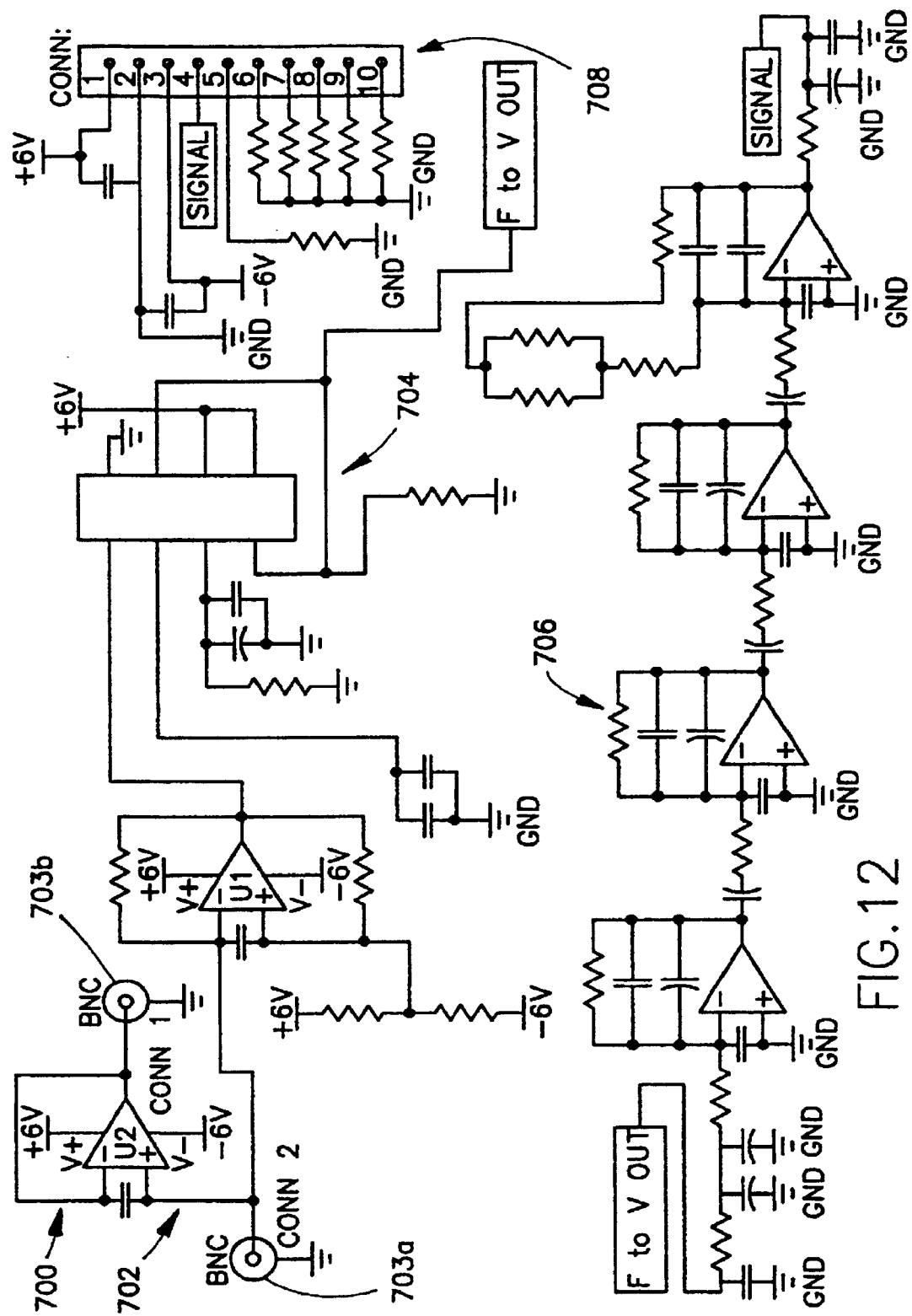
FIG. 12 is an electrical schematic of an occupancy detection system in accordance with the present invention.

An electric field (EF) circuit 700 (see schematic of FIG. 12) for the single-electrode remote respiration embodiment of the vehicle compartment occupancy system of the present invention consists of three main sections: a square wave generator 702, a frequency to voltage converter 704, and a series of low-pass filter and amplification stages 706. In a preferred embodiment of the present invention, the square wave generator 702 receives input signals from an input, such as via coaxial cables 703a, 703b, and is configured to output a square wave with a frequency of about 10 KHz with a duty cycle of about 50%. The frequency to voltage conversion portion 704 of the circuit is configured to accept the 10 KHz signal from the square wave generator 702 and to convert this frequency to a voltage output signal, which is then fed through a series of low-pass filters and amplification stages 706. The resistor and capacitor values and their configurations are selected in order to filter out signals with frequencies higher than those typical of respiration, such as approximately 1 Hz. The output signal from the low-pass filters and amplification stages is then fed to a connector 708. The output signal from the system is a function of the capacitance within the field region monitored by the system of the present invention. The capacitance within the field also determines the frequency output of the square wave generator.

Because of the dielectric properties of a living body, the presence of a person within the field affects the capacitance of the field. When the system is placed in a static environment (no motion), the capacitance within the electric field is a constant, and hence the frequency of the square wave generator remains the same, and the output signal of the circuit is a voltage of constant value. When a person is present and breathing within the field, the changing physical dimensions of a body that occur during respiration modulate the field capacitance in a characteristic rhythmic pattern. This modulation manifests as a frequency modulation of the square wave generator, which in turn is transformed to a voltage modulation via the frequency to voltage converter. The signal is then processed and amplified in order to filter out high frequency noise. Total amplification for the present system is about 103,000 times the output signal from the frequency to voltage conversion portion of the circuit.

With regard to the single electrode sensing system of the present invention, it is preferable to guard against low (for example, near about 3 Hz) frequency noise from the circuitry itself. It is thus desirable to utilize a very stable signal generator and to minimize system wiring capacitance and the like.

Single Electrode Experiment

Figure 13:
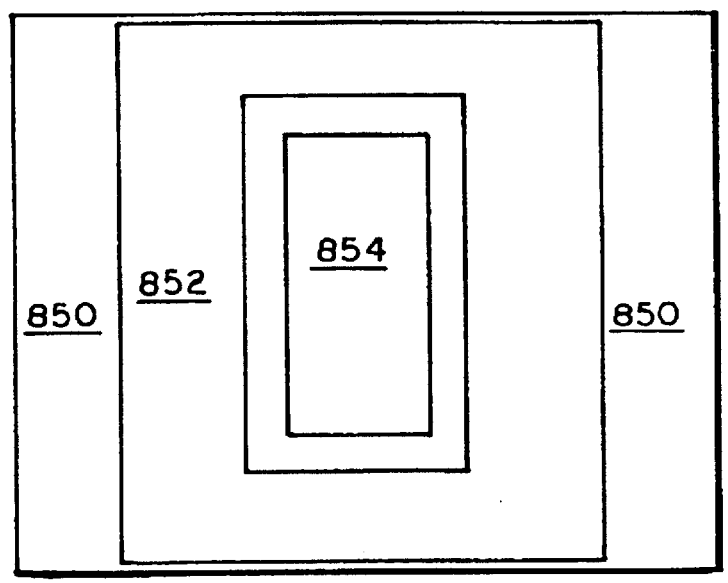
FIG. 13 is a plan view of an electrode and ground plane useful with the present invention.

Additional experiments have been conducted with the single-electrode remote respiration detection system using a 5.2 lb pork loin with a 1 Liter saline solution sack draped on top of the pork loin. The pork loin was chosen for the similarities between its dielectric properties and that of a human's. The pork loin and saline sack were placed on the end of a plastic shovel and then inserted into a baby seat at different levels above the remote respiration detection system. The system was allowed to "settle out" and then the shovel was moved slightly, in an effort to simulate the respiration of a baby. The electrode dimensions for this experiment were approximately as follows: ground plane 850—37"×31", reflective shield 852—37"×18", active electrode 854—7"×17" (see FIG. 13). The system was placed on top of a wooden table (not shown). A piece of cardboard (also not shown) was placed over the reflective shield and active electrode portion of the system. Also, an aluminum box (also not shown) was placed over the circuit of the system to act as a shield.

Figure 14:
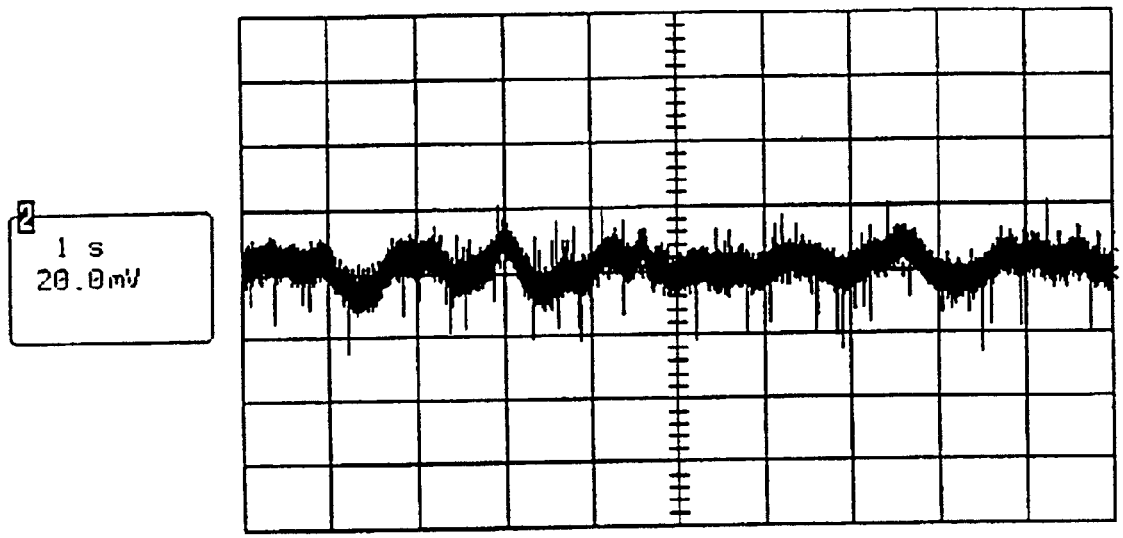
FIGS. 14–21 are graphical representations of signals detected by the occupancy detection system of the present invention for a simulated person at various locations and degree of movement within a compartment.
Figure 15:
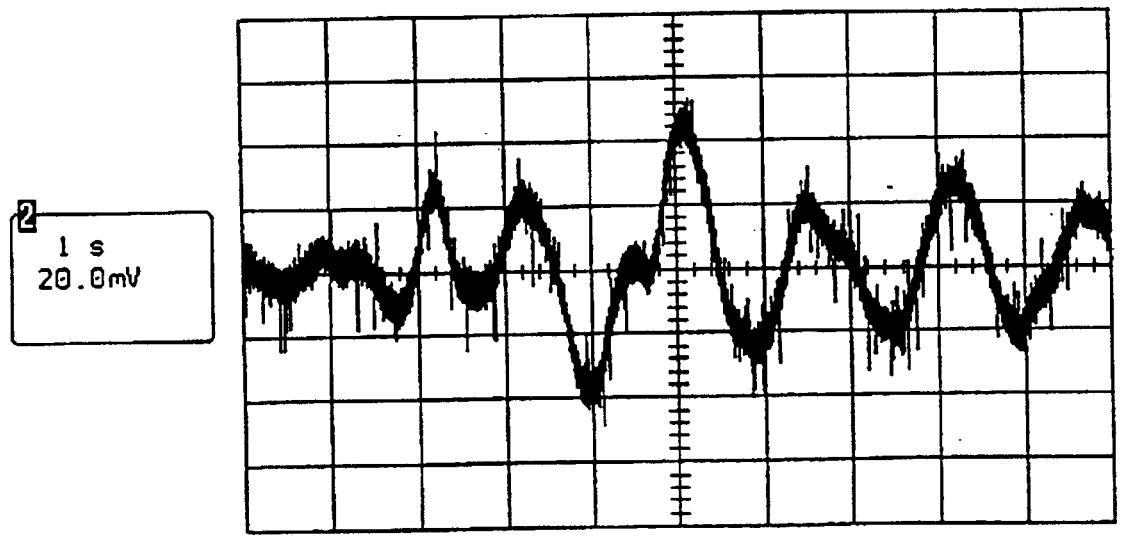
Figure 16:
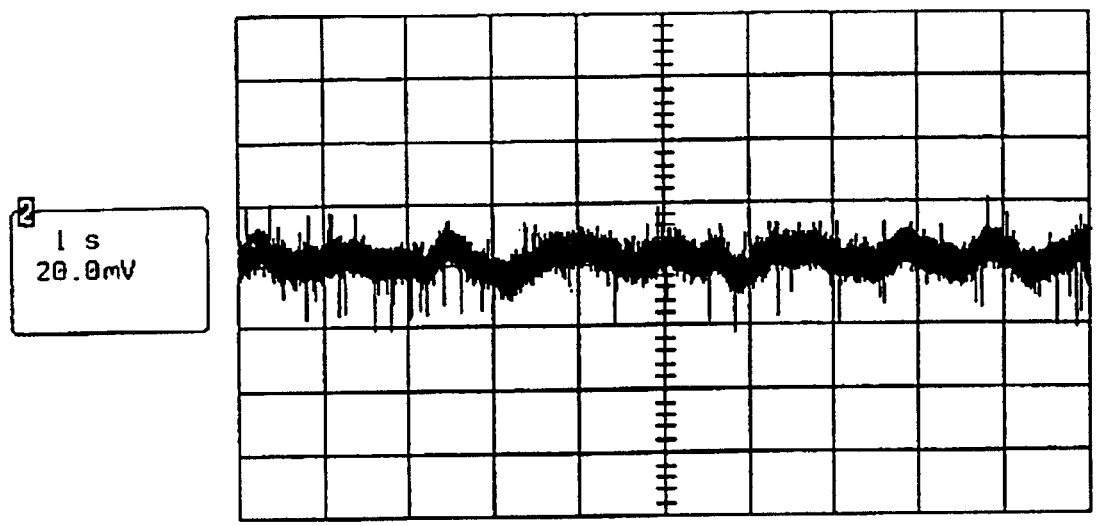
Figure 17:
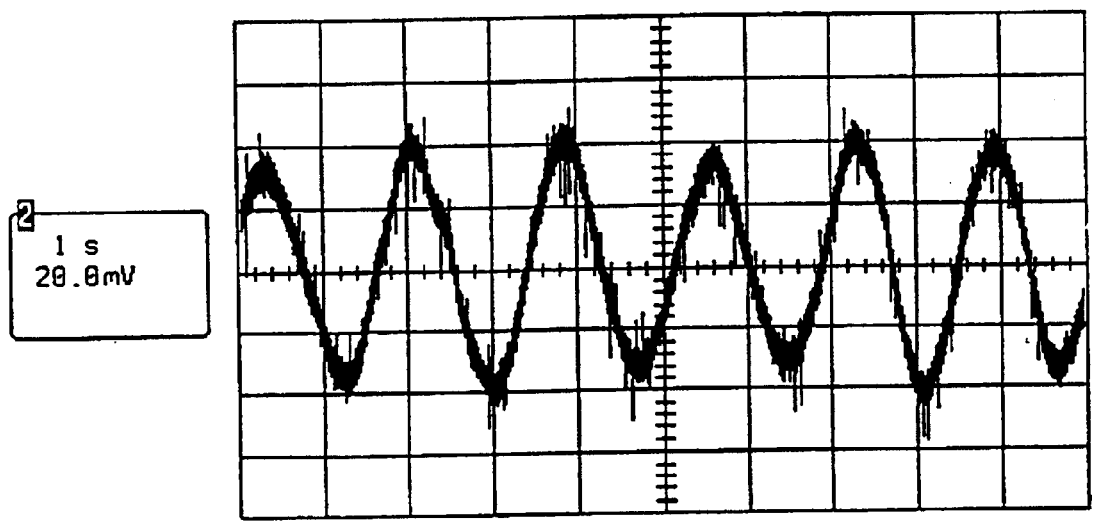
Figure 18:
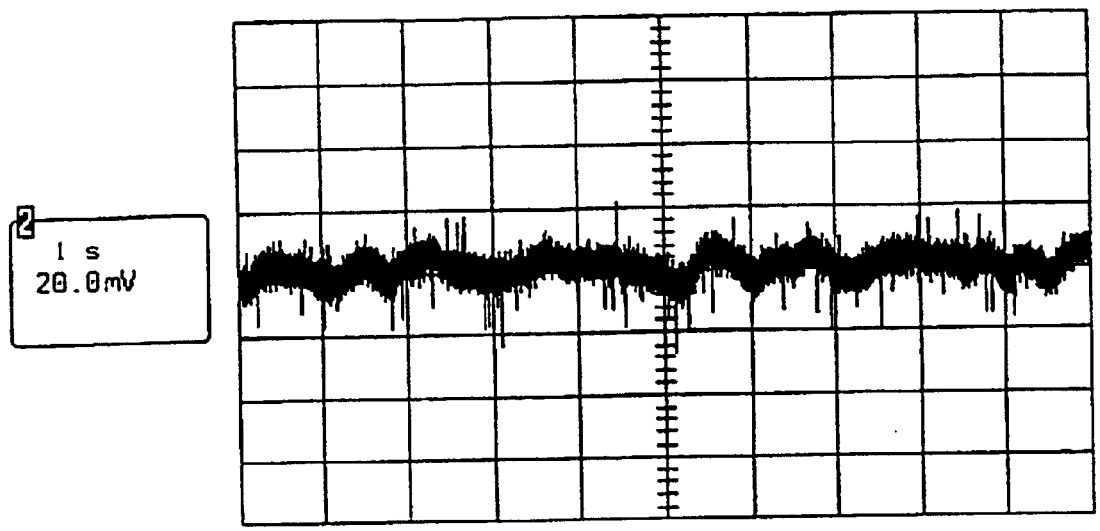
Figure 19:
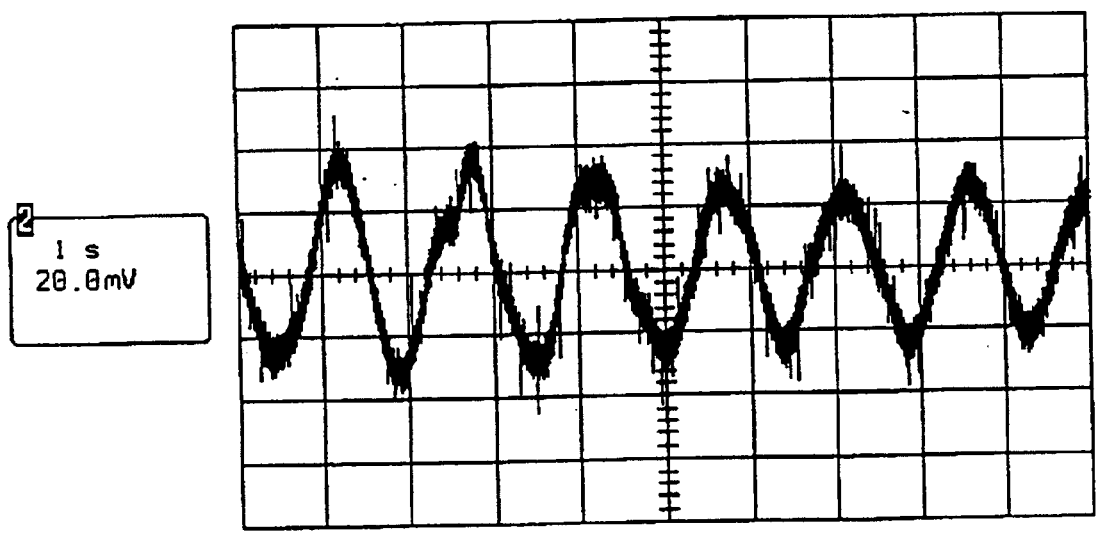
Figure 20:
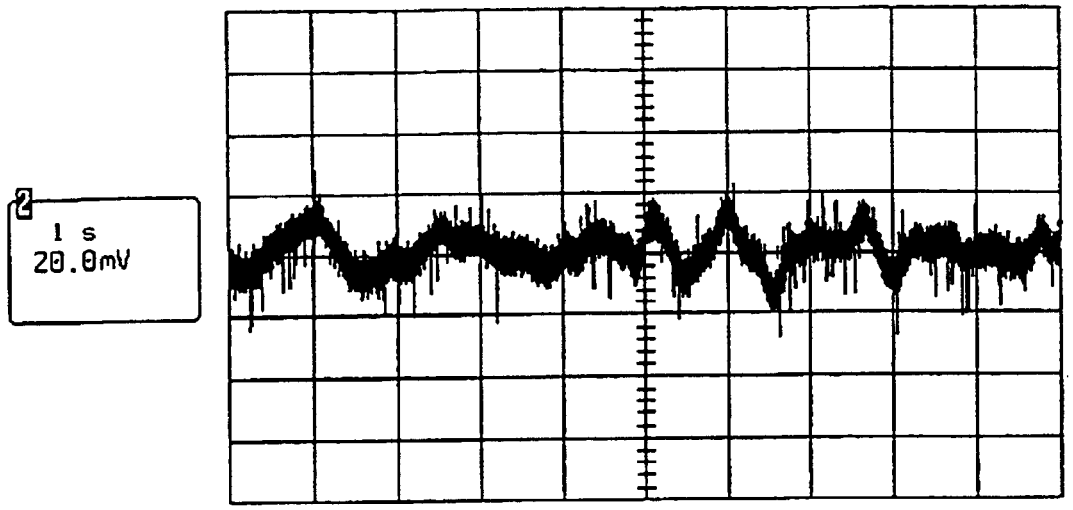
Figure 21:
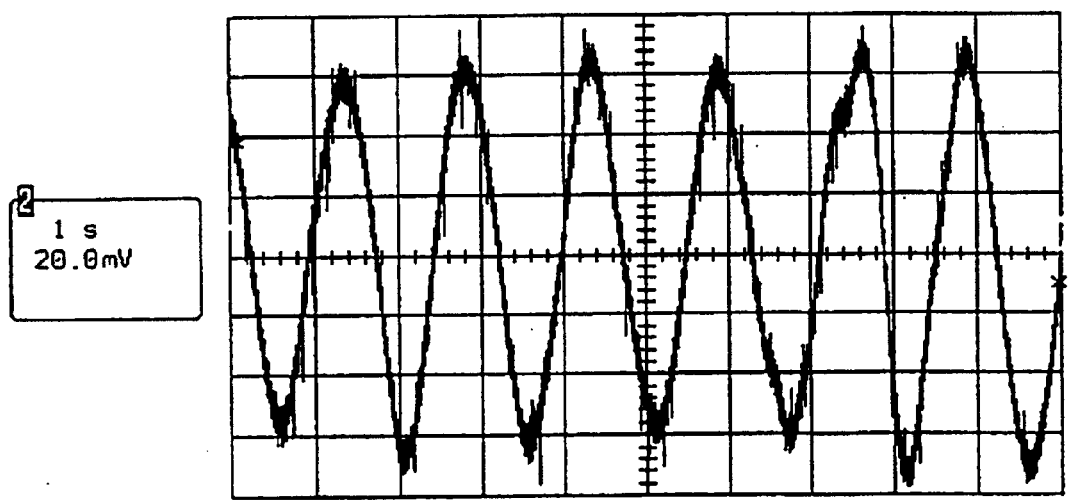

Several results were recorded with the system in this configuration. FIGS. 14–21 show oscilloscope traces which were recorded. More particularly, FIG. 14 shows the oscilloscope trace for a pork loin in a baby seat positioned approximately ten inches above the electrode, with no motion of the pork loin during testing; FIG. 15 shows the oscilloscope trace of the pork loin in the baby seat positioned approximately ten inches above the electrode, with the pork loin being moved to simulate breathing motion; FIG. 16 shows the oscilloscope trace for a pork loin in a baby seat positioned approximately seventeen inches above the electrode, with no motion of the pork loin during testing; FIG. 17 shows the oscilloscope trace of the pork loin in the baby seat positioned approximately seventeen inches above the electrode, with the pork loin being moved to simulate breathing motion; FIG. 18 shows the oscilloscope trace for a pork loin in a baby seat positioned approximately twenty-one inches above the electrode, with no motion of the pork loin during testing; FIG. 19 shows the oscilloscope trace of the pork loin in the baby seat positioned approximately twenty-one inches above the electrode, with the pork loin being moved to simulate breathing motion; FIG. 20 shows the oscilloscope trace for a pork loin in a baby seat positioned approximately thirty-one inches above the electrode, with no motion of the pork loin during testing; and FIG. 21 shows the oscilloscope trace of the pork loin in the baby seat positioned approximately thirty-one inches above the electrode, with the pork loin being moved to simulate breathing motion.

Additionally, for both the single and multi-electrode electric field vehicular compartment occupancy detection systems of the present invention, it is preferable that the EF circuit be grounded to the vehicle chassis so that the vehicle ground and the EF circuit ground are at the same potential, in order to substantially maintain the electric field lines within the vehicle compartment, and thus to reduce and preferably prevent the EF detection system from reacting to presence and/or movement of objects and/or persons outside the vehicle compartment. In circumstances where it may be desirable for the EF sensing system to monitor the periphery of the vehicle, such as, for example, for security purposes, a switch device, such as a relay or the like, may be used to switch the EF sensing system from a grounded to vehicle chassis state to an ungrounded to vehicle chassis state.

The present invention thus provides a vehicular compartment sensing system which is sensitive to detect human (and other living being) movements as sensitive as the thoracic and similar movements characteristic of human respiration. The system includes a false trigger elimination system as well as a hazardous condition discrimination system that dynamically determines whether a detected situation warrants a corrective action (such as actuation of a hazard alert) or whether the detected situation is not (or at least as yet is not) hazardous to a human (or pet) present in the compartment (such as might be the case should a parent leave a child in a vehicle cabin for a brief period while shopping, for example). The system of the present invention preferably includes an interface to a vehicle bus system such as a CAN and/or a LIN bus for communication of signals about the interior of the vehicle. Such communication can be a wired communication, such as via a cable, such as a twisted-pair cable, or optically, such as via a fiber optic cable, or wirelessly, such as by RF communication, such as by using a limited range RF communication, such as by using a BLUETOOTH protocol or the like. The system of the present invention preferably includes a pattern recognition algorithm that distinguishes changes in the electric field detected in the interior cabin of the vehicle, for example, as being characteristic of respiration of a living being. The present invention thus provides a living being respiration detection function (and particularly provides a human respiration detection function) that detects the presence of a living being within the portion of the vehicle compartment being monitored, at least based upon the frequency of changes in electric field detected and on the intensity of the changes in electric field detected. The system optionally and preferably includes both software and hardware filters that narrow the signal accepted to those frequencies likely to be characteristic of movement of and/or respiration by a person occupying the vehicle compartment being monitored. The system of the present invention includes a false trigger elimination means in order to reduce and/or eliminate any false hazard alerts.

Also, the vehicle compartment electric field variation detection system of the present invention can be used in conjunction with and/or as a supplement or auxiliary to other sensors or detectors or another occupancy detector or release system, such as any of those disclosed in U.S. Pat. Nos. 6,086,131 for SAFETY HANDLE FOR TRUNK OF VEHICLE; and 6,254,261 for ILLUMINATED SAFETY HANDLE FOR OPENING THE TRUNK OF A VEHICLE FROM INSIDE; and U.S. patent application, Ser. No. 09/516,831, filed Mar. 1, 2000 by Bingle et al. for SAFETY RELEASE FOR A TRUNK OF A VEHICLE, now U.S. Pat. No. 6,390,529; Ser. No. 09/648,560, filed Aug. 25, 2000 by Bingle et al. for SAFETY SYSTEM FOR A CLOSED COMPARTMENT OF A VEHICLE, now U.S. Pat. No. 6,485,081, and/or Ser. No. 09/852,483, filed May 10, 2001 for SAFETY HANDLE FOR OPENING THE TRUNK OF A VEHICLE FROM INSIDE, now U.S. Pat. No. 6,460,906, and/or European pat. application, Publication No. EP 1,039, 077 A2, published Sep. 27, 2000, which are all hereby incorporated herein by reference. The present invention may thus be used in connection with other sensors, such as the type disclosed in U.S. patent application, Ser. No. 09/484, 754, filed Jan. 18, 2000 for COMPARTMENT SENSING SYSTEM, now U.S. Pat. No. 6,480,103; and/or Ser. No. 09/648,560, filed Aug. 25, 2000 for SAFETY SYSTEM FOR A CLOSED COMPARTMENT OF A VEHICLE, now U.S. Pat. No. 6,485,081, and/or European Patent Application No. 00650023.5, published Sep. 27, 2000 as European Publication No. EP 1 039 077 A2 for SAFETY SYSTEM FOR A CLOSED COMPARTMENT OF A VEHICLE, the disclosures of which are hereby incorporated herein by reference. For example, a pyrodetector (such as those disclosed in U.S. Pat. No. 6,166,625, issued to Teowee et al. and entitled PYROELECTRIC INTRUSION DETECTION IN MOTOR VEHICLES, and U.S. patent application Ser. No. 09/484,754, filed on Jan. 18, 2000 by McCarthy et. al. for COMPARTMENT SENSING SYSTEM, now U.S. Pat. No. 6,480,103, which are hereby incorporated herein by reference) can be used that detects motion within the cabin of a vehicle by differential detection of thermal differences can be used in combination with the EF detector systems described herein.

Also, an image capture device (such as a CMOS or CCD multi-pixel video camera and as disclosed in U.S. Pat. Nos. 5,550,677; 5,670,935; 5,796,094; 6,087,953; and/or 6,172, 613; U.S. patent application, Ser. No. 09/793,002, filed Feb. 26, 2001 by Schofield et al. for VIDEO MIRROR SYSTEMS INCORPORATING AN ACCESSORY MODULE, now U.S. Pat. No. 6,690,268; Ser. No. 09/817,874, filed Mar. 26, 2001 by Quist et al. for INTERACTIVE AUTOMOTIVE REARVISION SYSTEM; and Ser. No. 09/734,440, filed Dec. 11, 2000 by DeLine et. al. for REARVIEW MIRROR ASSEMBLY INCORPORATING ELECTRICAL ACCESSORIES, now U.S. Pat. No. 6,366,213; and U.S. provisional application Ser. No. 60/309,023, filed Jul. 31, 2001 by MaMahon for VIDEO PROCESSOR MODULE FOR USE IN A VEHICULAR VIDEO SYSTEM, which are all hereby incorporated herein by reference) can be used in combination with the EF detector systems described herein. Also, a radar detector such as a Doppler radar detector can be included in the interior cabin of a vehicle (or in a trunk compartment of a vehicle) in conjunction with the EF detector systems described herein in order to detect human occupancy of the compartment. Also, a sound processing system including at least one microphone can be included in the interior cabin of a vehicle (or in a trunk compartment of a vehicle) in conjunction with the EF detector systems described herein in order to detect human occupancy of the compartment.

Also, an electric field variation detection system of the present invention that is responsive to pattern recognition of electric field variations that are characteristic of human respiration can be adapted for use in applications other than detection of persons trapped in a vehicle compartment. For example, an infant/baby monitoring system that utilizes the EFS system of the present invention can be used in a home or hospital or day-care facility to monitor the respiration status of, for example, a sleeping infant or child or even adult. Sleeping infant tragedies have arisen from what is termed Sudden Infant Death Syndrome where a sleeping infant ceases to breath and dies. Sleep apnea may occur in older children and adults as well. Using the present invention, a baby crib or a bed or the like can be monitored using an EFS system of the present invention and the respiration pattern of any infant or child or person therein can be tracked. Should, for example, the detected respiration pattern of the baby be one that indicates a potential hazard to the health of the infant, than an alert can be sounded to summon help (for example, a pager on a parent may be alerted or an alarm may sound or automatic contact be made to a remote emergency service such as a 911 service with a pre-recorded alarm message or the like). Such a system may be used in conjunction with a baby-minder video camera system (such as is disclosed in U.S. patent application Ser. No. 09/793,002, filed Feb. 26, 2001 by Schofield et al. for VIDEO MIRROR SYSTEMS INCORPORATING AN ACCESSORY MODULE, now U.S. Pat. No. 6,690,268, which is hereby incorporated herein by reference), and preferably where any alarm is transmitted wirelessly. The present invention can also be used in a hospital or nursing home to monitor the respiration of a patient or nursing home resident in order to log the pattern of respiration over a period (for example, over a 24 hour period) for diagnostic purposes and/or to raise an alarm/alert to summon medical attention should a hazardous respiration condition be detected. Also, the likes of cargo containers, restricted areas of facilities and the like can be equipped with an EFS system of the present invention and the presence of stowaways, illegal immigrants, unauthorized personnel and the like can be detected, and an alarm or alert can be initiated.

Changes and modifications in the specifically described embodiments can be carried out without departing from the principles of the present invention, which is intended to be limited only by the scope of the appended claims, as interpreted according to the principles of patent law.

The embodiments of the invention in which an exclusive property right or privilege is claimed are defined as follows:

1. A vehicle compartment sensing system for detecting the presence of a person in a vehicle compartment, the vehicle having an ignition, said vehicle compartment sensing system comprising:

at least one electric field sensor which is operable to detect occupancy in the vehicle compartment by detecting a change in an electric field within the compartment which is indicative of a presence of a person within the compartment, said at least one electric field sensor generating an electric field sensor output;

a temperature sensor operable to detect an ambient temperature within the vehicle compartment, said temperature sensor generating a temperature sensor output; and a control, said control being operable to receive an input indicative of said temperature sensor output and an input indicative of said electric field sensor output, said control being operable to process said inputs and to generate an alert output, said control generating said alert output when (a) said electric field sensor output is indicative of a presence of a person within the compartment, (b) said temperature sensor output is indicative of the ambient temperature within the vehicle compartment being at or above a threshold temperature, and (c) a predetermined period of time has elapsed after the ignition of the vehicle is turned off;

wherein said change in said electric field is indicative of a respiration characteristic.

2. The vehicle compartment sensing system of claim 1 further including at least one electric field generator which is operable to generate said electric field within the compartment.

3. The vehicle compartment sensing system of claim 2, wherein said at least one electric field generator and said at least one electric field sensor are positioned adjacent to one another and positionable along a surface of the vehicle compartment.

4. The vehicle compartment sensing system of claim 2, wherein said at least one electric field generator and said at least one electric field sensor are positionable at opposed facing surfaces of the vehicle compartment.

5. The vehicle compartment sensing system of claim 2, wherein said at least one electric field generator comprises at least one transmitting electrode and said at least one electric field sensor comprises at least one receiving electrode.

6. The vehicle compartment sensing system of claim 1, wherein said at least one electric field sensor comprises at least two electric field sensors positionable within the vehicle compartment.

7. The vehicle compartment sensing system of claim 1, wherein said at least one electric field sensor is further operable to generate said electric field within the vehicle compartment.

8. The vehicle compartment sensing system of claim 1, wherein said control comprises a microprocessor.

9. The vehicle compartment sensing system of claim 8, wherein said microprocessor is operable to receive said inputs and to generate said alert output.

10. The vehicle compartment sensing system of claim 8, wherein said microprocessor is operable to receive at least one other input, said at least one other input comprising at least one of a door lock status, a door position, a window position, a vehicle motion status, an ignition position, a signal from a radar detector within the vehicle compartment, a signal from an ultrasound detector within the vehicle compartment, a signal from an imaging detector within the vehicle compartment, a signal from a carbon dioxide detector within the vehicle compartment and a signal from a carbon monoxide detector within the vehicle compartment.

11. The vehicle compartment sensing system of claim 10, wherein said alert output comprises at least one of a communication with a remote receiver, activation of a ventilation system of the vehicle, actuation of at least one of a horn or a light of the vehicle, activation of a security system, unlocking of the doors of the vehicle, opening of at least one window of the vehicle, and activation of a remote transducer.

12. The vehicle compartment sensing system of claim 10, wherein said alert output comprises a communication with a remote receiver, said communication comprising at least one of contacting an emergency number from a communication system of the vehicle, calling the owner of the vehicle via a portable telephone of the owner and sending an image of the vehicle compartment to the remote receiver.

13. The vehicle compartment sensing system of claim 1, wherein said threshold temperature is indicative of a hazardous condition within the vehicle compartment.

14. The vehicle compartment sensing system of claim 13, wherein said alert output comprises at least one of a corrective action to at least partially alleviate the hazardous condition and a communication to communicate to a person exteriorly of the vehicle that the hazardous condition exists.

15. The vehicle compartment sensing system of claim 1, wherein said alert output comprises at least one of a communication with a remote receiver, activation of a ventilation system of the vehicle, actuation of at least one of a horn or a light of the vehicle, activation of a security system, unlocking of the doors of the vehicle, opening of at least one window of the vehicle, and activation of a remote transducer.

16. The vehicle compartment sensing system of claim 1, wherein said alert output comprises a communication with a remote receiver, said communication comprising at least one of contacting an emergency number from a communication system of the vehicle, calling the owner of the vehicle via a portable telephone of the owner and sending an image of the vehicle compartment to the remote receiver.

17. The vehicle compartment sensing system of claim 1, wherein said compartment sensing system includes a timer, said control being operable to receive said inputs for a period of time following an activating event, said vehicle compartment sensing system being deactivated at the end of said period of time following said activating event.

18. The vehicle compartment sensing system of claim 17, wherein said activating event comprises a signal being received by said control which is indicative of a person exiting the vehicle.

19. The vehicle compartment sensing system of claim 1, wherein said control is operable to actuate one or more accessories in response to said inputs.

20. The vehicle compartment sensing system of claim 1, wherein said threshold temperature comprises a variable threshold temperature that varies in response to an amount of time that has elapsed after the ignition of the vehicle is turned off.

21. The vehicle compartment sensing system of claim 1, wherein said vehicle compartment sensing system comprises a dynamic hazardous condition detection system.

22. The vehicle compartment sensing system of claim 21, wherein said control generates said alert output when multiple threshold temperatures are reached, said multiple threshold temperatures corresponding to multiple predetermined periods of time elapsing after the ignition of the vehicle is turned off.

23. The vehicle compartment sensing system of claim 22, wherein said multiple threshold temperatures comprise first and second threshold temperatures and said multiple predetermined periods of time comprises first and second predetermined periods of time.

24. The vehicle compartment sensing system of claim 23, wherein said control generates said alert output when said electric field sensor output is indicative of a presence of a person within the compartment and one of (a) said temperature sensor output is indicative of the ambient temperature within the vehicle compartment being at or above said first threshold temperature and said first predetermined period of time has elapsed, and (b) said temperature sensor output is indicative of the ambient temperature within the vehicle compartment being at or above said second threshold temperature and said second predetermined period of time has elapsed, said first threshold temperature being less than said second threshold temperature and said first predetermined period of time being greater than said second predetermined period of time.

25. A vehicle compartment sensing system for detecting the presence of a person in a vehicle compartment, the vehicle having an ignition, said vehicle compartment sensing system, comprising:
at least one electric field generator which is operable to generate a electric field within the compartment;
at least one electric field sensor which is operable to detect said electric field within the vehicle compartment, said at least one electric field sensor generating an electric field sensor output;
a temperature sensor operable to detect an ambient temperature within the vehicle compartment, said temperature sensor generating a temperature sensor output; and
a control which is operable to determine occupancy of the vehicle compartment in response to a change in said electric field being detected by said at least one electric field sensor, said change in said electric field being indicative of respiration of a person within the compartment, said control being operable to receive an input indicative of said temperature sensor output and an input indicative of said electric field sensor output, said control being operable to process said inputs and to generate an alert output, said control generating said alert output when (a) said electric field sensor output is indicative of respiration of a person within the compartment, (b) said temperature sensor output is indicative of the ambient temperature within the vehicle compartment being at or above a threshold temperature, and (c) a predetermined period of time has elapsed after the ignition of the vehicle is turned off.

26. The vehicle compartment sensing system of claim 25, wherein said control is operable to actuate at least one accessory in response to said change in said electric field.

27. The vehicle compartment sensing sensing of claim 25, wherein said control is further operable in response to at least one other input, said control being operable to actuate at least one accessory in response to said change in said electric field and said at least one other input.

28. The vehicle compartment sensing system of claim 27, wherein said at least one other input comprises at least one of a door lock status, a door position, a window position, a vehicle motion status, an ignition position, a signal from a radar detector within the vehicle compartment, a signal from an ultrasound detector within the vehicle compartment, a signal from an imaging detector within the vehicle compartment, a signal from a carbon dioxide detector within the vehicle compartment and a signal from a carbon monoxide detector within the vehicle compartment.

29. The vehicle compartment sensing system of claim 27, wherein said at least one accessory comprises at least one of a communication system, a security system, a door lock system of the vehicle, a window of the vehicle, a ventilation system of the vehicle, an air conditioning system of the vehicle, a heater of the vehicle, a light of the vehicle and a horn of the vehicle.

30. The vehicle compartment sensing system of claim 25, wherein said control is operable to determine occupancy for an activated period of time after receiving a signal which is indicative of a person exiting the vehicle.

31. The vehicle compartment sensing system of claim 30, wherein said control is deactivated at the end of said activated period of time.

32. The vehicle compartment sensing system of claim 31, wherein said control is reactivated in response to a signal indicative of a person entering or opening the vehicle.

33. The vehicle compartment sensing system of claim 25, wherein said threshold temperature comprises a variable threshold temperature that varies in response to an amount of time that has elapsed after the ignition of the vehicle is turned off.

34. The vehicle compartment sensing system of claim 25, wherein said vehicle compartment sensing system comprises a dynamic hazardous condition detection system.

35. The vehicle compartment sensing system of claim 34, wherein said control generates said alert output when multiple threshold temperatures are reached and multiple predetermined periods of time have elapsed after the ignition of the vehicle is turned off, said multiple threshold temperatures corresponding to respective ones of said multiple predetermined periods of time.

36. The vehicle compartment sensing system of claim 35, wherein said multiple threshold temperatures comprise first and second threshold temperatures and said multiple predetermined periods of time comprises first and second predetermined periods of time.

37. The vehicle compartment sensing system of claim 36, wherein said control generates said alert output when said electric field sensor output is indicative of a presence of a person within the compartment and one of (a) said temperature sensor output is indicative of the ambient temperature within the vehicle compartment being at or above said first threshold temperature and said first predetermined period of time has elapsed, and (b) said temperature sensor output is indicative of the ambient temperature within the vehicle compartment being at or above said second threshold temperature and said second predetermined period of time has elapsed, said first threshold temperature being less than said second threshold temperature and said first predetermined period of time being greater than said second predetermined period of time.

38. A method for sensing the presence of a person in a vehicle compartment, the vehicle having an ignition, said method comprising:

providing at least one electric field sensor at the vehicle compartment;

sensing a change in an electric field within the vehicle compartment which is indicative of a presence of a person within the vehicle compartment;

providing a temperature sensor at the vehicle compartment;

sensing an ambient temperature within the vehicle compartment;

generating an alert output when (a) said sensed change in the electric field is indicative of a presence of a person within the compartment, (b) said sensed ambient temperature is at or above a threshold temperature, and (c) a predetermined period of time has elapsed after the ignition of the vehicle is turned off;

wherein sensing a change in an electric field comprises sensing a change in an electric field which is indicative of respiration of a person within the vehicle compartment.

39. The method of claim 38 including:

sensing at least one vehicle characteristic; and actuating at least one accessory in response to the at least one vehicle characteristic and said at least one electric field sensor.

40. The method of claim 39, wherein sensing at least one vehicle characteristic comprises at least one of determining a door lock status, determining a door position, determining a window position, determining a vehicle motion status, determining an ignition position, receiving a signal from a radar detector within the vehicle compartment, receiving a signal from an ultrasound detector within the vehicle compartment, receiving a signal from an imaging detector within the vehicle compartment, receiving a signal from a carbon dioxide detector within the vehicle compartment and receiving a signal from a carbon monoxide detector within the vehicle compartment.

41. The method of claim 39, wherein actuating at least one accessory comprises at least one of communicating with a remote receiver, activating a ventilation system of the vehicle, actuating at least one of a horn or a light of the vehicle, activating a security system of the vehicle, unlocking the doors of the vehicle, opening at least one window of the vehicle, and activating a remote transducer.

42. The method of claim 38 including providing at least one electric field generator which is operable to generate the electric field within the vehicle compartment.

43. The method of claim 38, wherein sensing a change in an electric field comprises sensing a change in an electric field which is indicative of a biometric characteristic of a person within the vehicle compartment.

44. The method of claim 38 including activating said electric field sensor in response to a signal indicative of a person exiting the vehicle.

45. The method of claim 44 including deactivating said electric field sensor following a period of time after receiving said signal indicative of a person exiting the vehicle.

46. The method of claim 38, wherein said step of generating an alert output comprises generating an alert output when said electric field sensor output is indicative of a presence of a person within the compartment and one of (a) said sensed ambient temperature is at or above a first threshold temperature and a first predetermined period of time has elapsed following the ignition of the vehicle being turned off, and (b) said sensed ambient temperature is at or above a second threshold temperature and a second predetermined period of time has elapsed following the ignition of the vehicle being turned off, said first threshold temperature being less than said second threshold temperature and said first predetermined period of time being greater than said second predetermined period of time.

* * * * *

UNITED STATES PATENT AND TRADEMARK OFFICE
CERTIFICATE OF CORRECTION

PATENT NO. : 6,768,420 B2  Page 1 of 1
APPLICATION NO. : 09/992119
DATED : July 27, 2004
INVENTOR(S) : Kevin C. McCarthy et al.

It is certified that error appears in the above-identified patent and that said Letters Patent is hereby corrected as shown below:

Column 11:
Line 7, "5mV" should be --50mV--

Column 19:
Line 43, Claim 25, Delete "," after "system".

Column 20:
Line 6, Claim 27, "sensing" should be --system-- in the second occurrence.

Signed and Sealed this

Seventeenth Day of April, 2007

JON W. DUDAS
*Director of the United States Patent and Trademark Office*